(12) United States Patent
Morisaki et al.

(10) Patent No.: US 10,651,839 B2
(45) Date of Patent: May 12, 2020

(54) POWER SWITCHING APPARATUS

(71) Applicant: Mitsubishi Electric Corporation, Chiyoda-ku (JP)

(72) Inventors: Shota Morisaki, Chiyoda-ku (JP); Yoshiko Tamada, Chiyoda-ku (JP); Yoshitaka Naka, Chiyoda-ku (JP); Yukihiko Wada, Chiyoda-ku (JP); Hiroyuki Takagi, Chiyoda-ku (JP)

(73) Assignee: Mitsubishi Electric Corporation, Chiyoda-ku (JP)

( * ) Notice: Subject to any disclaimer, the term of this patent is extended or adjusted under 35 U.S.C. 154(b) by 290 days.

(21) Appl. No.: 15/747,542

(22) PCT Filed: Aug. 4, 2016

(86) PCT No.: PCT/JP2016/072922
§ 371 (c)(1),
(2) Date: Jan. 25, 2018

(87) PCT Pub. No.: WO2017/026367
PCT Pub. Date: Feb. 16, 2017

(65) Prior Publication Data
US 2018/0375508 A1 Dec. 27, 2018

(30) Foreign Application Priority Data
Aug. 7, 2015 (JP) .................................. 2015-157413

(51) Int. Cl.
*H02H 3/00* (2006.01)
*H03K 17/16* (2006.01)
(Continued)

(52) U.S. Cl.
CPC ....... *H03K 17/162* (2013.01); *H03K 17/0822* (2013.01); *H03K 17/122* (2013.01); *H03K 17/163* (2013.01)

(58) Field of Classification Search
None
See application file for complete search history.

(56) References Cited

U.S. PATENT DOCUMENTS

| 9,716,385 B2 * | 7/2017 | Dickey | ................ H03K 17/122 |
| 2004/0036511 A1 | 2/2004 | Otoshi et al. | |
| 2015/0364922 A1 * | 12/2015 | Dickey | .................... H03K 3/01 307/115 |

FOREIGN PATENT DOCUMENTS

| JP | 2002-94363 A | 3/2002 |
| JP | 2003-88098 A | 3/2003 |

(Continued)

OTHER PUBLICATIONS

International Search Report dated Oct. 11, 2016 in PCT/JP2016/072922 filed Aug. 4, 2016.

*Primary Examiner* — Stephen W Jackson
(74) *Attorney, Agent, or Firm* — Oblon, McClelland, Maier & Neustadt, L.L.P.

(57) ABSTRACT

A power switching apparatus includes a plurality of semiconductor switching devices connected in parallel with each other and a plurality of balance resistor units. The plurality of balance resistor units each have one end connected to a control electrode of an associated semiconductor switching device and the other end to which a common control signal is input. Each balance resistor unit is configured to have a resistance value switched between different values depending on whether the plurality of semiconductor switching devices are turned on or turned off in accordance with the control signal.

9 Claims, 13 Drawing Sheets

(51) Int. Cl.
*H03K 17/12* (2006.01)
*H03K 17/082* (2006.01)

(56) References Cited

FOREIGN PATENT DOCUMENTS

| | | |
|---|---|---|
| JP | 2003-319638 A | 11/2003 |
| JP | 2004-32409 A | 1/2004 |
| JP | 2006-50776 A | 2/2006 |
| JP | 2008-79379 A | 4/2008 |
| WO | 2014/136252 A1 | 9/2014 |
| WO | 2016/038717 A1 | 3/2016 |

* cited by examiner

POWER SWITCHING APPARATUS

TECHNICAL FIELD

The present disclosure relates to a power switching apparatus including a plurality of semiconductor switching devices connected in parallel with each other and a gate drive circuit for these semiconductor switching devices. The present invention also relates to a power switching apparatus further including a protection circuit for these semiconductor switching devices.

BACKGROUND ART

When a plurality of power semiconductor switching devices are connected in parallel, a closed circuit is formed by respective gate to drain (or gate to source) capacitances of the semiconductor elements and a wiring inductance. In this closed circuit, parasitic oscillation may occur during turn-on or turn-off of the semiconductor switching devices (parasitic oscillation is likely to occur particularly during turn-off of the semiconductor switching devices). Occurrence of parasitic oscillation may cause breakage of the semiconductor switching devices. This parasitic oscillation is a problem peculiar to the configuration where a plurality of semiconductor switching devices are connected in parallel.

In order to avoid this problem, generally a gate resistor having a relatively large resistance value is connected to the gate of each semiconductor switching device. For example, according to Patent Document 1 (Japanese Patent Laying-Open No. 2003-088098), parasitic oscillation is suppressed by a damping resistor on the output terminal side of a gate drive circuit.

CITATION LIST

Patent Document

PTD 1: Japanese Patent Laying-Open No. 2003-088098

SUMMARY OF INVENTION

Technical Problem

Connection of a gate resistor having a relatively large resistance value as described above leads to a problem that the turn-on time and the turn-off time increase. This is for the reason that the turn-on time and the turn-off time are determined by the product of the resistance value of the gate resistor and the gate to source capacitance of the semiconductor switching device. The increased turn-on time and the increased turn-off time cause increase of a turn-on loss and increase of a turn-off loss, respectively. Accordingly, addition of the gate resistor for suppressing parasitic oscillation during turn-off causes undesired increase of not only the turn-off loss but also the turn-on loss.

A similar problem arises when radiation noise due to high switching speed of the semiconductor switching device is to be suppressed. The radiation noise is caused by an abrupt change of the drain voltage and the drain current. An example is a case where radiation noise occurring when a semiconductor switching device is turned on is a problem to be solved. In this case, a gate resistor having a relatively large resistance value is added to reduce the rate of change of the drain voltage and the drain current when the semiconductor switching device is turned on, undesired increase of not only the turn-on loss but also the turn-off occurs.

The present disclosure has been made in view of the above problems and is directed to a power switching apparatus including a plurality of parallel-connected semiconductor switching devices. The present disclosure aims to take measures to solve a problem arising in one of the turn-on operation and the turn-off operation so as not to increase a loss in the other operation.

Solution to Problem

A power switching apparatus of the present disclosure includes a plurality of semiconductor switching devices connected in parallel with each other, a plurality of balance resistor units, and a control circuit. The plurality of semiconductor switching devices are connected in parallel with each other and each have a first main electrode, a second main electrode, and a control electrode. The plurality of balance resistor units are each associated with a respective one of the plurality of semiconductor switching devices, and each have one end connected to the control electrode of the associated semiconductor switching device. The control circuit outputs, to the other end of each balance resistor unit, a common control signal for turning on and turning off each semiconductor switching device. Each balance resistor unit is configured to have a resistance value switched between different values depending on whether the plurality of semiconductor switching devices are turned on or turned off in accordance with the control signal. The balance resistor unit is provided, for plurality of power semiconductor switching devices connected in parallel, as a balance resistor for suppressing parasitic oscillation occurring during switching of the semiconductor switching devices.

Advantageous Effects of Invention

According to the invention, the resistance value of each balance resistor unit can be set to different values for turn-on and turn-off of a plurality of semiconductor switching devices. Therefore, when measures to solve a problem arising in one of the turn-on and turn-off operations are taken, increase of a loss in the other operation can be prevented.

DESCRIPTION OF EMBODIMENTS

Figure 1:
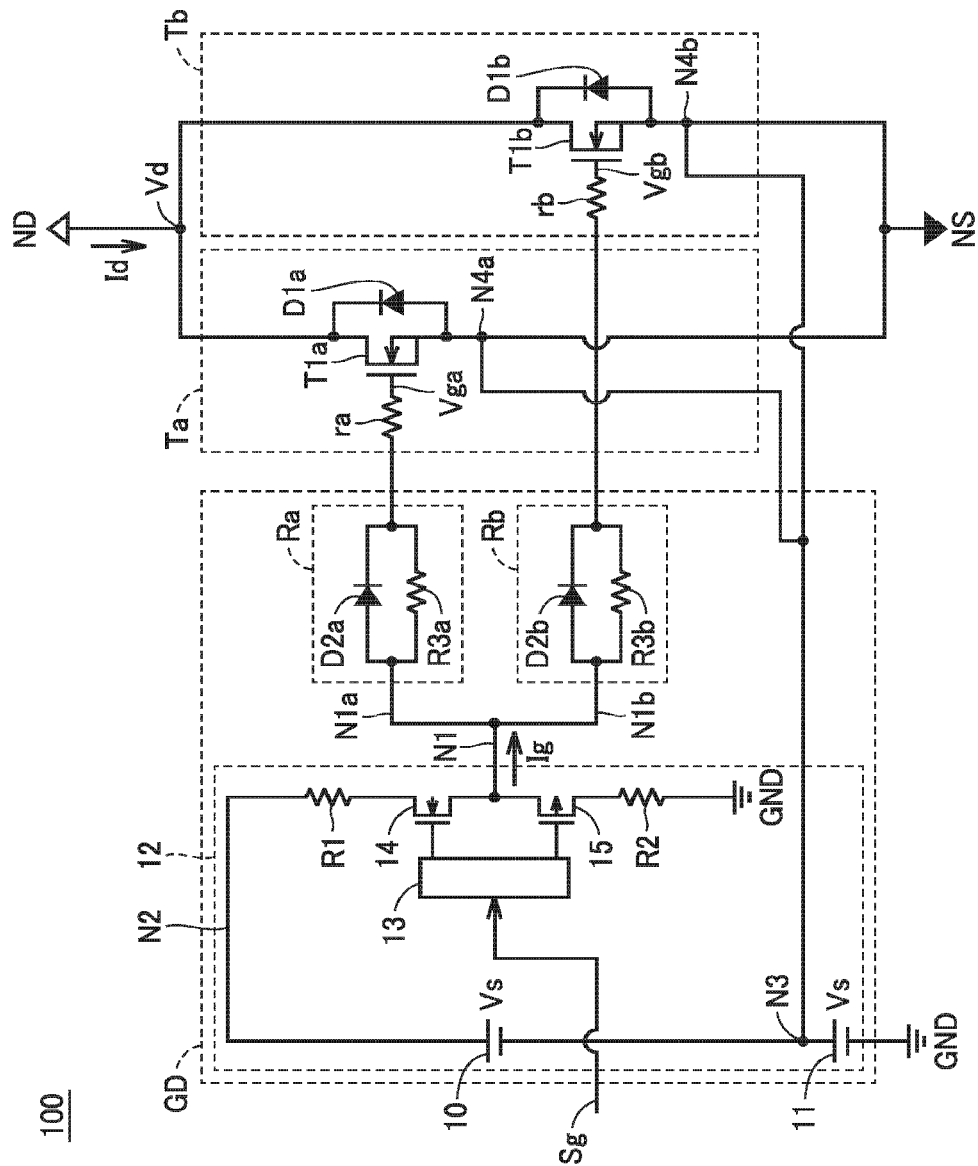
FIG. 1 is a circuit diagram showing a configuration of a power switching apparatus 100 in a first embodiment.

In the following, each embodiment is described in detail with reference to the drawings. The same or corresponding components are denoted by the same reference characters, and a description thereof is not repeated.

First Embodiment

[Configuration of Power Switching Apparatus 100]

FIG. 1 is a circuit diagram showing a configuration of a power switching apparatus 100 in a first embodiment. Referring to FIG. 1, power switching apparatus 100 includes semiconductor modules Ta, Tb connected in parallel with each other, and a drive circuit GD.

Semiconductor module Ta includes a power NMOSFET (N-channel Metal Oxide Semiconductor Field Effect Transistor) as a semiconductor switching device T1a connected between a high-voltage side node ND and a low-voltage side node NS, and a diode D1a. Diode D1a is connected in antiparallel with semiconductor switching device T1a (i.e., the drain of the NMOSFET (T1a) is connected to the cathode of diode D1a). Diode D1a is provided to cause freewheeling current to flow when semiconductor switching device T1a is turned off. In FIG. 1, an internal gate resistor of the NMOSFET (T1a) is denoted by ra.

Semiconductor module Tb likewise includes a power NMOSFET as a semiconductor switching device T1b connected between high-voltage side node ND and low-voltage side node NS, and a diode D1b. Diode D1b is connected in antiparallel with semiconductor switching device T1b. Diode D1b is provided to cause freewheeling current to flow when semiconductor switching device T1b is turned off. In FIG. 1, an internal gate resistor of the NMOSFET (T1b) is denoted by rb.

Semiconductor switching devices T1a, T1b are each a self-arc-extinguishing-type semiconductor device including a first main electrode, a second main electrode, and a control electrode, and switching current flowing between the first and second main electrodes on or off in accordance with a signal applied to the control electrode. FIG. 1 illustrates an example where N-type power MOSFETs are used as semiconductor switching devices T1a, T1b. In this case, the first main electrode is the source of the NMOSFET, the second main electrode is the drain of the NMOSFET, and the control electrode is the gate of the NMOSFET.

Drive circuit GD includes balance resistor units Ra, Rb and a control circuit 12. Balance resistor unit Ra is connected between an output node N1a and the gate of semiconductor switching device T1a. Output node N1a branches off from output node N1 of control circuit 12 to output a control signal to the control electrode of semiconductor switching device T1a. Balance resistor unit Rb is connected between an output node N1b and the gate of semiconductor switching device T1a. Output node N1b branches off from output node N1 of control circuit 12 to output a control signal to the control electrode of semiconductor switching device T1b. Balance resistor units Ra, Rb are provided as balance resistors for synchronizing the turn-on/turn off timing of semiconductor switching device T1a with the turn-on/turn off timing of semiconductor switching device T1b. For a plurality of parallel-connected power semiconductor switching devices, balance resistor units Ra, Rb are also provided for suppressing parasitic oscillation during turn-on or turn-off of the power semiconductor switching devices.

More specifically, balance resistor unit Ra includes a diode D2a and a resistor element R3a connected in parallel with each other. The cathode of diode D2a is connected to the gate of semiconductor switching device T1a, and the anode of diode D2a is connected to output node N1a of control circuit 12. Balance resistor unit Rb likewise includes a diode D2b and a resistor element R3b connected in parallel with each other. The cathode of diode D2b is connected to the gate of semiconductor switching device T1b, and the anode of diode D2b is connected to output node N1b of control circuit 12.

Control circuit 12 outputs a common control signal for turning on and turning off a plurality of semiconductor switching devices T1a, T1b. More specifically, control circuit 12 includes a switch control circuit 13, a turn-on NMOSFET 14 as a switching element, a turn-off PMOSFET (P-channel MOSFET) 15 as a switching element, a turn-on gate resistor R1 for adjusting the turn-on switching speed, a turn-off gate resistor R2 for adjusting the turn-off switching speed, a first DC power supply 10, and a second DC power supply 11. The resistance value of turn-on gate resistor R1 is determined so that a required turn-on switching speed is achieved. The resistance value of turn-off gate resistor R2 is determined so that a required turn-off switching speed is achieved. The turn-on gate resistor may be referred to herein as first resistor element and the turn-off gate resistor may be referred to herein as second resistor element.

First and second DC power supplies 10, 11 are connected in series with each other (the negative node of DC power supply 10 is connected to the positive node of DC power supply 11). A connection node N3 connecting first and second DC power supplies 10, 11 is connected to source N4a of the NMOSFET (T1a) and source N4b of the NMOSFET (T1b). In the following, respective output voltages (power supply voltages) of first and second DC power supplies 10, 11 are denoted by Vs.

Turn-on gate resistor R1 and NMOSFET 14 are connected in series between positive node N2 of first DC power supply 10 and output node N1 of control circuit 12. In FIG. 1, while turn-on gate resistor R1 is connected to the drain of NMOSFET 14, turn-on gate resistor R1 may be connected to the source of NMOSFET 14. Likewise, turn-off gate resistor R2 and PMOSFET 15 are connected in series between output node N1 of control circuit 12 and a ground node GND. In FIG. 1, while turn-off gate resistor R2 is connected to the drain of PMOSFET 15, turn-on gate resistor R1 may be connected to the source of PMOSFET 15.

Switch control circuit 13 controls turn-on MOSFET 14 and turn-off MOSFET 15 in response to external control signal Sg. In an example in the first embodiment, switch control circuit 13 turns on MOSFET 14 and turns off MOSFET 15 in response to external control signal Sg at the high level (H level). As a result, semiconductor switching devices T1a, T1b are turned on. Switch control circuit 13 turns off MOSFET 14 and turns on MOSFET 15 in response to external control signal Sg at the low level (L level). As a result, semiconductor switching devices T1a, T1b are turned off.

[Operation of Power Switching Apparatus 100]

An operation of power switching apparatus 100 in FIG. 1 is described. Power semiconductor modules Ta, Tb have the same circuit configuration and balance resistor units Ra, Rb also have the same circuit configuration, and therefore, turn-on/turn-off of semiconductor switching device T1a occurs almost simultaneously with turn-on/turn-off of semiconductor switching device T1b. In the following, therefore, chiefly an operation of power semiconductor module Ta is described.

Figure 2:
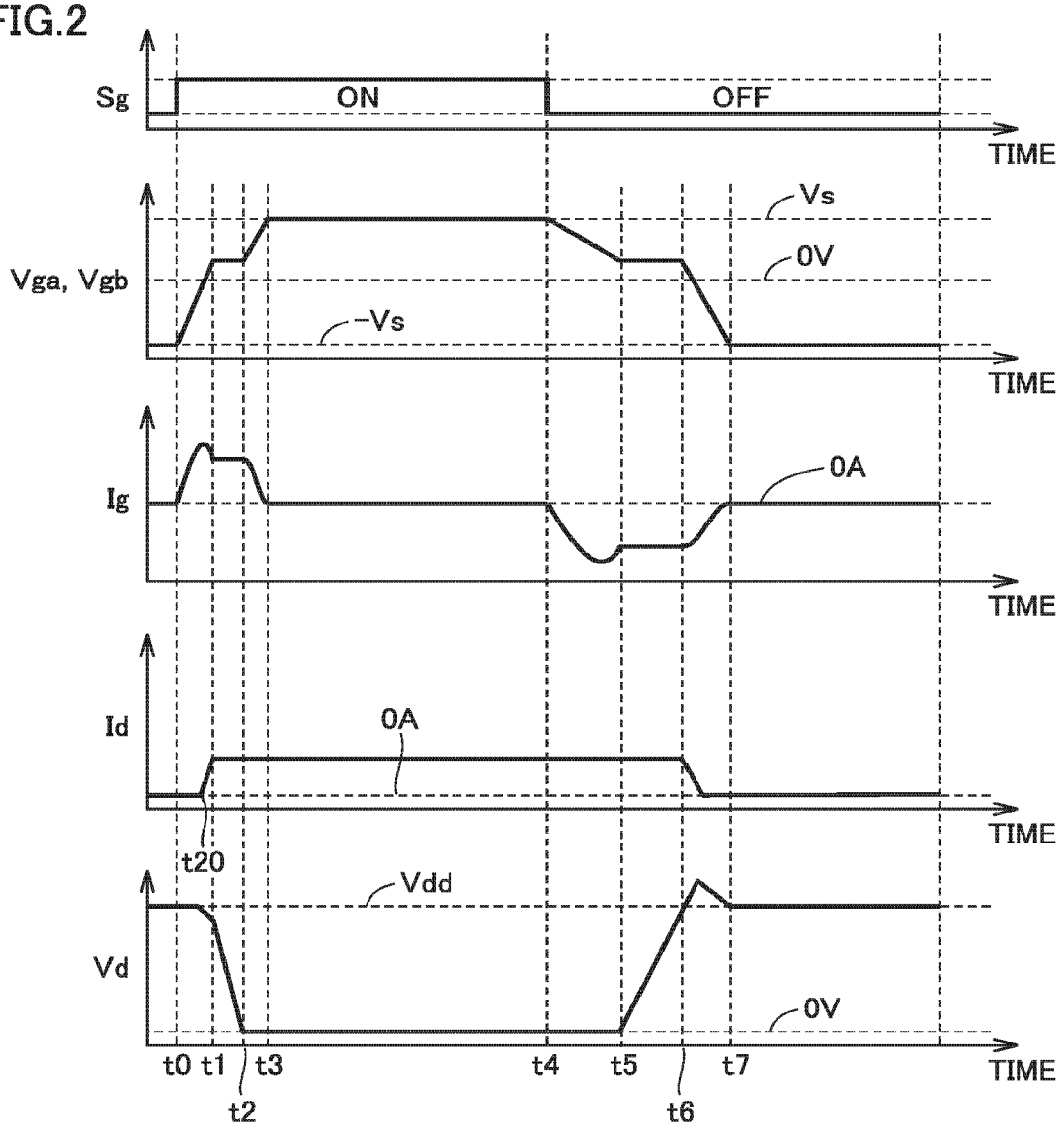
FIG. 2 is a timing chart showing an operation of power switching apparatus 100 in FIG. 1.

FIG. 2 is a timing chart showing an operation of power switching apparatus 100 in FIG. 1. FIG. 2 shows, successively from the top, external control signal Sg, gate voltages Vga, Vgb of semiconductor switching devices T1a, T1b, control current (gate current) Ig that is output from output node N1 of control circuit 12, drain current Id flowing from high-voltage side node ND to semiconductor switching devices T1a, T1b, and drain voltage Vd of semiconductor switching devices T1a, T1b. The horizontal axis represents time (TIME).

Referring to FIGS. 1 and 2, at time t0, external control signal Sg switches from the L level to the H level. In response to this, turn-on MOSFET 14 of control circuit 12 switches to the ON state and turn-off MOSFET 15 switches to the OFF state. Accordingly, gate current flows from positive node N2 of first DC power supply 10 to semiconductor switching device T1a through turn-on gate resistor R1, diode D2a of balance resistor unit Ra, and internal gate resistor ra. As a result, a positive voltage is applied between the gate and the source of first semiconductor switching device T1a. In the case of balance resistor unit Ra in FIG. 1, substantially the whole gate current flows through forward-direction diode D2a and no gate current flows through resistor element R3a.

At time t20, the gate to source voltage increases to become equal to or more than a threshold voltage of semiconductor switching device T1a. Then, semiconductor switching device T1a becomes conductive (turned on). Drain current Id flows to semiconductor switching device T1a through a main circuit (not shown) connected between the drain and the source of semiconductor switching device T1a. The turn-on time at this time is determined by the product of the total resistance value of internal gate resistor ra of semiconductor switching device T1a and turn-on gate resistor R1, and the gate to source capacitance of semiconductor switching device T1a. The larger the resistance value, the longer the turn-on time.

The period from time t1 to time t2 is a mirror period in which gate voltage Vg is kept constant by the mirror effect of semiconductor switching device T1a. In the mirror period, variation of voltage Vd between main electrodes causes variation of the parasitic capacitance of semiconductor switching device T1a, and gate voltage Vg is therefore kept constant. At time t2, the mirror period ends. Then, gate voltage Vg increases again. At time t3, gate voltage Vga reaches positive power supply voltage Vs. Accordingly, the turn-on operation ends.

At time t4, external control signal Sg switches from the H level to the L level. In response to this, turn-on MOSFET 14 of control circuit 12 switches to the OFF state and turn-off MOSFET 15 switches to the ON state. Accordingly, gate current flows from the gate of semiconductor switching device T1a to ground node GND successively through internal gate resistor ra, resistor element R3a of balance resistor unit Ra, and turn-off gate resistor R2. As a result, a negative voltage is applied between the gate and the source of first semiconductor switching device T1a. In the case of balance resistor unit Ra in FIG. 1, gate current in the reverse direction of diode D2a is blocked, and therefore, substantially the whole gate current flows through resistor element R3a.

As the gate to source voltage decreases to become less than the threshold voltage of semiconductor switching device T1a, semiconductor switching device T1a is turned off. Then, drain current Id does not flow through the main circuit (not shown) connected between the drain and the source. The turn-off time at this time is determined by the product of the total resistance value of internal gate resistor ra of semiconductor switching device T1a, resistor element R3a of balance resistor unit Ra, and turn-off gate resistor R2, and the gate to source capacitance of semiconductor switching device T1a.

At time t5, voltage Vd between main electrodes starts increasing. Then, the period from time t5 to time t6 is a mirror period in which gate voltage Vg is kept substantially constant. At time t6, the mirror period ends. Then, gate voltage Vg starts decreasing again. At time t7, gate voltage Vga reaches negative power supply voltage−Vs. Accordingly, the turn-off operation ends.

Effects of First Embodiment

In FIG. 1, if balance resistor units Ra, Rb are not equipped with diodes D2a, D2b but equipped with resistor elements R3a, R3b only, not only the turn-off gate resistance value but also the turn-on gate resistance value increases and thus not only the turn-off loss but also the turn-on loss increases. The conventional art often employs such a configuration for the purpose of suppressing parasitic oscillation during turn-off.

In contrast, in power switching apparatus 100 in the present embodiment, balance resistor unit Ra is formed by parallel-connected resistor element R3a and diode D2a. Cathode of diode D2a is connected to the gate of semiconductor switching device T1a. Accordingly, when semiconductor switching device T1a is turned on, no gate current Ig flows through resistor R3a. As a result, the value of the turn-on gate resistance is determined by turn-on gate resistor R1 and internal gate resistor ra of power semiconductor module Ta. Even when the resistance value of resistor R3a of balance resistor unit Ra is increased for the purpose of suppressing parasitic oscillation during turn-off, the turn-on time does not increase. In other words, in power switching apparatus 100 in the present embodiment, parasitic oscillation occurring during switching operation can be suppressed without increasing the turn-on loss of parallel-connected semiconductor switching devices T1a, T1b.

[Modification]

When increase of the turn-off loss is to be prevented, the polarity of diodes D2a, D2b forming balance resistor units Ra, Rb is reversed, with respect to the polarity thereof in FIG. 1. Specifically, the cathode of diode D2a is connected to output node N1a of control circuit 12, and the anode thereof is connected to the gate of semiconductor switching device T1a. The cathode of diode D2b is connected to output node N1b of control circuit 12, and the anode thereof is connected to the gate of semiconductor switching device T1b. An operation of power switching apparatus 100 in this case is described. In particular, an operation of semiconductor module Ta, balance resistor unit Ra, and control circuit 12 is described.

In response to switching of external control signal Sg from the L level to the H level, turn-on MOSFET 14 of control circuit 12 switches to the ON state and turn-off MOSFET 15 switches to the OFF state. Accordingly, gate current flows from positive node N2 of first DC power supply 10 to semiconductor switching device T1a through turn-on gate resistor R1, resistor element R3a of balance resistor unit Ra, and internal gate resistor ra of power semiconductor module Ta. As a result, a positive voltage is applied between the gate and the source of first semiconductor switching device T1a.

As the gate to source voltage increases to become equal to or more than the threshold voltage of semiconductor switching device T1a, semiconductor switching device T1a becomes conductive. The turn-on time at this time is determined by the product of the total resistance value of internal gate resistor ra of semiconductor switching device T1a, resistor element R3a of balance resistor unit Ra, and turn-on gate resistor R1, and the gate to source capacitance of semiconductor switching device T1a.

In contrast, in response to switching of external control signal Sg from the H level to the L level, turn-on MOSFET 14 of control circuit 12 switches to the OFF state and turn-off MOSFET 15 switches to the ON state. Accordingly, gate current flows from the gate of semiconductor switching device T1a to ground node GND successively through internal gate resistor ra, diode D2a of balance resistor unit Ra, and turn-off gate resistor R2. As a result, a negative voltage is applied between the gate and the source of first semiconductor switching device T1a.

As the gate to source voltage decreases to become less than the threshold voltage of semiconductor switching device T1a, semiconductor switching device T1a is turned off. The turn-off time at this time is determined by the product of the total resistance value of internal gate resistor ra of semiconductor switching device T1a and turn-off gate resistor R2, and the gate to source capacitance of semiconductor switching device T1a.

As seen from the above, when semiconductor switching device T1a is turned off, no gate current flows through resistor element R3a of balance resistor unit Ra. Therefore, even when the resistance value of resistor element R3a of balance resistor unit Ra is increased for the purpose of suppressing parasitic oscillation during switching, the turn-off time does not increase. In other words, in the power switching apparatus in the modification described above, parasitic oscillation occurring during switching operation can be suppressed without increasing the turn-off loss of parallel-connected semiconductor switching devices T1a, T1b.

Second Embodiment

[Configuration of Power Switching Apparatus 101]

Figure 3:
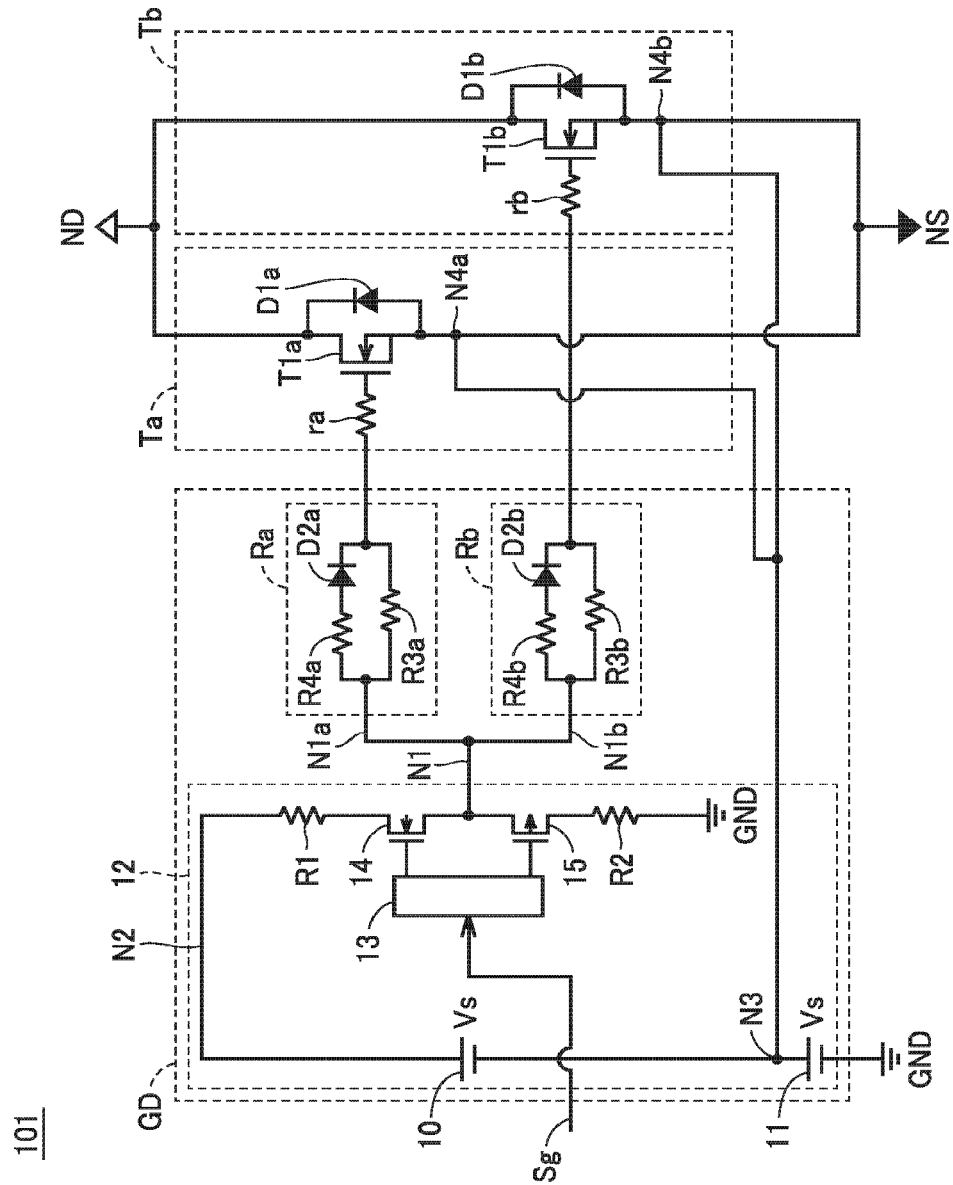
FIG. 3 is a circuit diagram showing a configuration of a power switching apparatus 101 in a second embodiment.

FIG. 3 is a circuit diagram showing a configuration of a power switching apparatus 101 in a second embodiment. Power switching apparatus 101 in FIG. 3 differs from power switching apparatus 100 in FIG. 1 in the configuration of balance resistor units Ra, Rb. Other features in FIG. 3 are similar to those in FIG. 1. Therefore, the same or corresponding components are denoted by the same reference characters, and the description thereof is not repeated.

As shown in FIG. 3, balance resistor unit Ra includes a diode D2a and a resistor element R4a connected in series with each other and arranged between output node N1a of control circuit 12 and the gate of semiconductor switching device T1a. Balance resistor unit Ra further includes a resistor element R3a connected in parallel with the combination of diode D2a and resistor element R4a. The cathode of diode D2a is connected to the gate of semiconductor switching device T1a. The order in which diode D2a and resistor element R4a are connected may be reversed with respect to the order shown in FIG. 3.

Balance resistor unit Rb likewise includes a diode D2b and a resistor element R4b connected in series with each other and arranged between output node N1b of control circuit 12 and the gate of semiconductor switching device T1b. Balance resistor unit Rb further includes a resistor element R3b connected in parallel with the combination of diode D2b and resistor element R4b. The cathode of diode D2b is connected to the gate of semiconductor switching device T1b. The order in which diode D2b and resistor element R4b are connected may be reversed with respect to the order shown in FIG. 3.

[Operation of Power Switching Apparatus 101]

An operation of power switching apparatus 101 in FIG. 3 is described. Power semiconductor modules Ta, Tb have the same circuit configuration and balance resistor units Ra, Rb also have the same circuit configuration, and therefore, turn-on/turn-off of semiconductor switching device T1a occurs almost simultaneously with turn-on/turn-off of semiconductor switching device T1b. In the following, therefore, chiefly an operation of power semiconductor module Ta is described.

In response to switching of external control signal Sg from the L level to the H level, turn-on MOSFET 14 of control circuit 12 switches to the ON state and turn-off MOSFET 15 switches to the OFF state. Accordingly, gate current flows from positive node N2 of first DC power supply 10 to semiconductor switching device T1a through turn-on gate resistor R1, resistor elements R3a, R4a and diode D2a of balance resistor unit Ra, and internal gate resistor ra of power semiconductor module Ta. As a result, a positive voltage is applied between the gate and the source of first semiconductor switching device T1a to cause semiconductor switching device T1a to be turned on. The turn-on time at this time is determined by the product of the total resistance value of internal gate resistor ra of semiconductor switching device T1a, resistor elements R3a, R4a of balance resistor unit Ra, and turn-on gate resistor R1, and the gate to source capacitance of semiconductor switching device T1a.

In contrast, in response to switching of external control signal Sg from the H level to the L level, turn-on MOSFET 14 of control circuit 12 switches to the OFF state and turn-off MOSFET 15 switches to the ON state. Accordingly, gate current flows from the gate of semiconductor switching device T1a to ground node GND successively through internal gate resistor ra, resistor element R3a of balance resistor unit Ra, and turn-off gate resistor R2. As a result, a negative voltage is applied between the gate and the source of first semiconductor switching device T1a to cause semiconductor switching device T1a to be turned off. The turn-off time at this time is determined by the product of the total resistance value of internal gate resistor ra of semiconductor switching device T1a, resistor element R3a of balance resistor unit Ra, and turn-off gate resistor R2, and the gate to source capacitance of semiconductor switching device T1a.

Specifically, in the configuration described above, the turn-on resistance value of balance resistor unit Ra is given by:

$$R3a \times R4a/(R3a+R4a) \tag{1}$$

where R3a, R4a are resistance values of resistor elements R3a, R4a, respectively. The turn-off resistance value of balance resistor unit Ra is given by R3a. It is therefore possible to make the turn-on resistance value of balance resistor unit Ra smaller than the turn-off resistance value of balance resistor unit Ra. As a result, parasitic oscillation during switching can be suppressed, without useless increase of the turn-on loss of parallel-connected semiconductor switching devices. Moreover, in the configuration of the first embodiment shown in FIG. 1, charge passes through only one resistor element between the gate of semiconductor module Ta and the gate of semiconductor module Tb during parasitic oscillation. In contrast, charge passes through multiple resistor elements in the configuration of the second embodiment, which produces a greater effect of suppressing parasitic oscillation occurring during switching.

[Modification]

When increase of the turn-off loss is to be prevented, the polarity of diodes D2a, D2b forming balance resistor units Ra, Rb is reversed, with respect to the polarity thereof in FIG. 3. Specifically, the cathode of diode D2a is connected to output node N1a of control circuit 12, and the cathode of diode D2b is connected to output node N1b of control circuit 12.

In this case, the turn-on resistance value of balance resistor unit Ra is given by R3a and the turn-off resistance value of balance resistor unit Ra is given by the expression (1) above. It is therefore possible to make the turn-off resistance value of balance resistor unit Ra smaller than the turn-on resistance value of balance resistor unit Ra. As a result, a resistance value of resistor elements R3a, R4a can be determined so as to suppress parasitic oscillation during switching, without useless increase of the turn-off loss of parallel-connected semiconductor switching devices.

Third Embodiment

[Configuration of Power Switching Apparatus 102]

Figure 4:
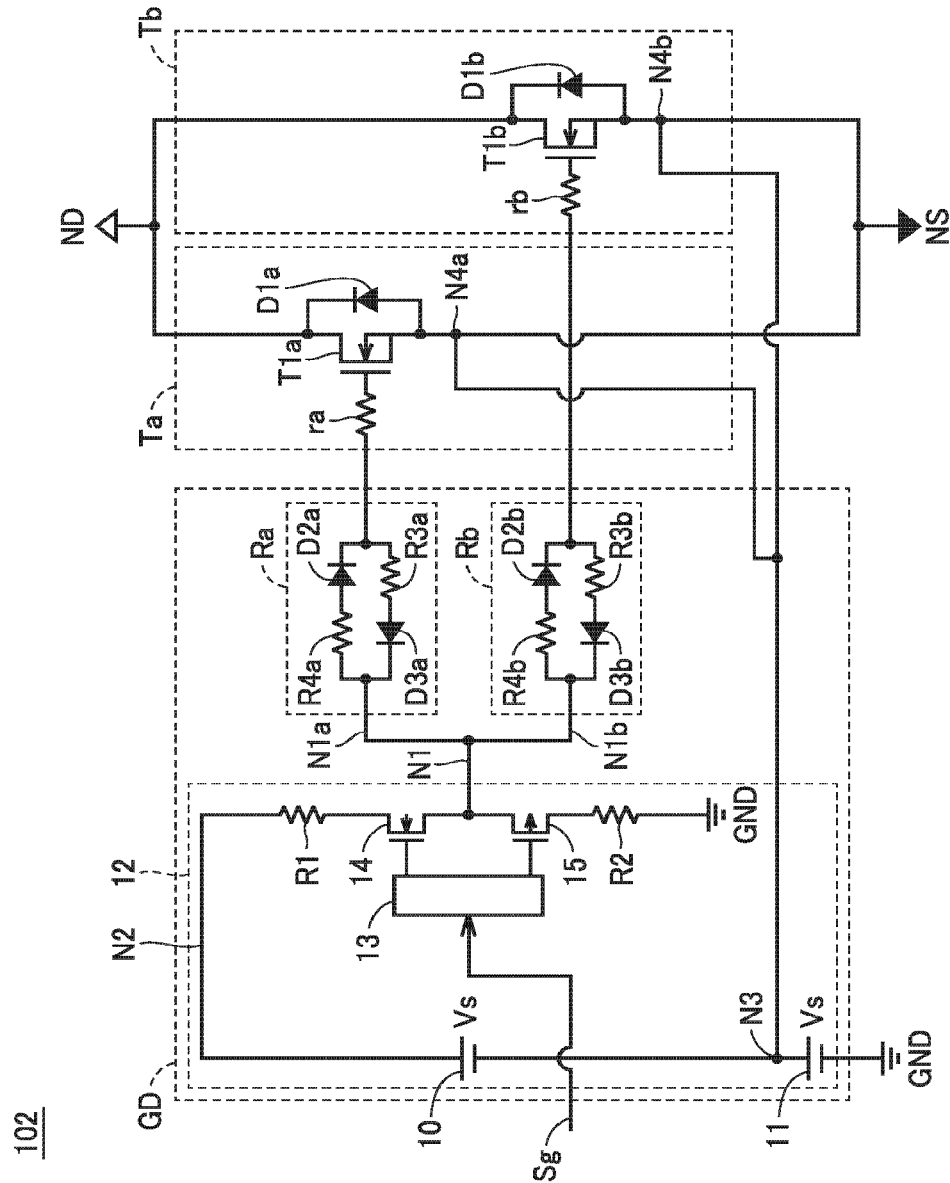
FIG. 4 is a circuit diagram showing a configuration of a power switching apparatus 102 in a third embodiment.

FIG. 4 is a circuit diagram showing a configuration of a power switching apparatus 102 in a third embodiment. Power switching apparatus 102 in FIG. 4 differs from power switching apparatus 100 in FIG. 1 in the configuration of balance resistor units Ra, Rb. Other features in FIG. 4 are similar to those in FIG. 1. Therefore, the same or corresponding components are denoted by the same reference characters, and the description thereof is not repeated.

As shown in FIG. 4, balance resistor unit Ra includes a diode D2a and a resistor element R4a connected in series with each other and arranged between output node N1a of control circuit 12 and the gate of semiconductor switching device T1a. Balance resistor unit Ra further includes a resistor element R3a and a diode D3a connected in series with each other and in parallel with the combination of diode D2a and resistor element R4a. The cathode of diode D2a is connected to the gate of semiconductor switching device T1a. The cathode of diode D3a is connected to output node N1a of control circuit 12. Namely, the polarity of diode D2a is opposite to the polarity of diode D3a. The order in which diode D2a and resistor element R4a are connected may be reversed with respect to the order shown in FIG. 4, and the order in which resistor element R3a and diode D3a are connected may also be reversed with respect to the order shown in FIG. 4.

Balance resistor unit Rb likewise includes a diode D2b and a resistor element R4b connected in series with each other and arranged between output node N1b of control circuit 12 and the gate of semiconductor switching device T1b. Balance resistor unit Rb further includes a resistor element R3b and a diode D3b connected in series with each other and in parallel with the combination of diode D2b and resistor element R4b. The cathode of diode D2b is connected to the gate of semiconductor switching device T1b. The cathode of diode D3b is connected to output node N1b of control circuit 12. Namely, the polarity of diode D2b is opposite to the polarity of diode D3b. The order in which diode D2b and resistor element R4b are connected may be reversed with respect to the order shown in FIG. 4, and the order in which resistor element R3b and diode D3b are connected may also be reversed with respect to the order shown in FIG. 4.

[Operation of Power Switching Apparatus 102]

An operation of power switching apparatus 102 in FIG. 4 is described. Power semiconductor modules Ta, Tb have the same circuit configuration and balance resistor units Ra, Rb also have the same circuit configuration, and therefore, turn-on/turn-off of semiconductor switching device T1a occurs almost simultaneously with turn-on/turn-off of semiconductor switching device T1b. In the following, therefore, chiefly an operation of power semiconductor module Ta is described.

In response to switching of external control signal Sg from the L level to the H level, turn-on MOSFET 14 of control circuit 12 switches to the ON state and turn-off MOSFET 15 switches to the OFF state. Accordingly, gate current flows from positive node N2 of first DC power supply 10 to semiconductor switching device T1a through turn-on gate resistor R1, resistor element R4a and diode D2a of balance resistor unit Ra, and internal gate resistor ra of power semiconductor module Ta. As a result, a positive voltage is applied between the gate and the source of first semiconductor switching device T1a to cause semiconductor switching device T1a to be turned on. The turn-on time at this time is determined by the product of the total resistance value of internal gate resistor ra of semiconductor switching device T1a, resistor element R4a of balance resistor unit Ra, and turn-on gate resistor R1, and the gate to source capacitance of semiconductor switching device T1a.

In contrast, in response to switching of external control signal Sg from the H level to the L level, turn-on MOSFET 14 of control circuit 12 switches to the OFF state and turn-off MOSFET 15 switches to the ON state. Accordingly, gate current flows from the gate of semiconductor switching device T1a to ground node GND successively through internal gate resistor ra, resistor element R3a and diode D3a of balance resistor unit Ra, and turn-off gate resistor R2. As a result, a negative voltage is applied between the gate and the source of first semiconductor switching device T1a to cause semiconductor switching device T1a to be turned off. The turn-off time at this time is determined by the product of the total resistance value of internal gate resistor ra of semiconductor switching device T1a, resistor element R3a of balance resistor unit Ra, and turn-off gate resistor R2, and the gate to source capacitance of semiconductor switching device T1a.

Specifically, in the configuration described above, the turn-on resistance value of balance resistor unit Ra is given by R4a and the turn-off resistance value of balance resistor unit Ra is given by R3a, where R3a and R4a are respective resistance values of resistor elements R3a and R4a, respectively. Thus, the turn-on resistance value (R4a) of balance resistor unit Ra and the turn-off resistance value (R3a) of balance resistor unit Ra can be adjusted totally independently of each other. Therefore, when increase of the turn-on loss is to be prevented, the resistance value of resistor element R3a forming balance resistor unit Ra can be set larger to suppress parasitic oscillation during switching, without influencing the turn-on loss at all. Likewise, when increase of the turn-off loss is to be prevented, the resistance value of resistor element R4a forming balance resistor unit Ra can be set larger to suppress parasitic oscillation during switching operation of semiconductor switching devices connected in parallel, without useless increase of the loss in any one of the turn-on switching and the turn-off switching.

Fourth Embodiment

[Configuration of Power Switching Apparatus 103]

Figure 5:
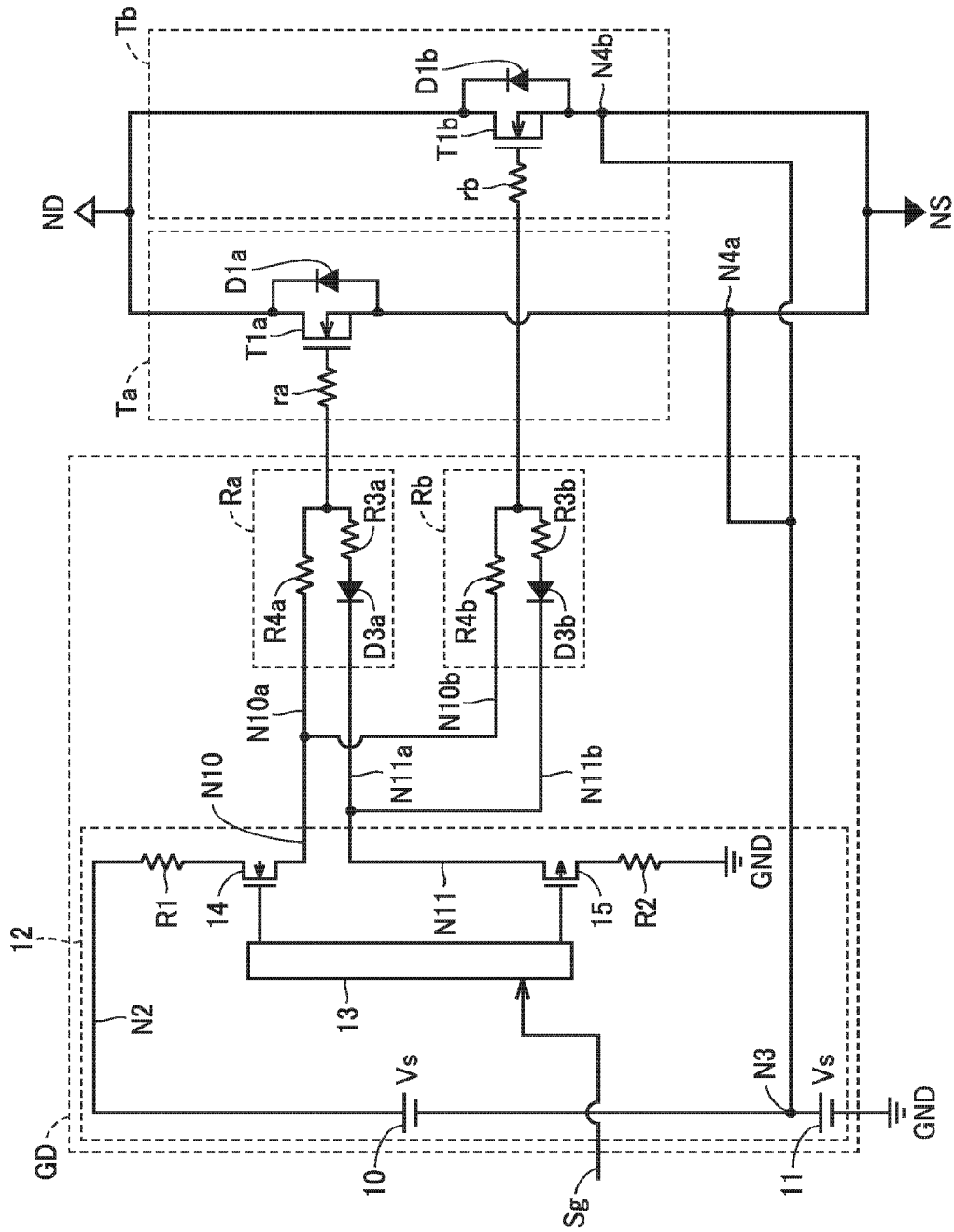
FIG. 5 is a circuit diagram showing a configuration of a power switching apparatus 103 in a fourth embodiment.

FIG. 5 is a circuit diagram showing a configuration of a power switching apparatus 103 in a fourth embodiment. Power switching apparatus 103 in FIG. 5 differs from power switching apparatus 100 in FIG. 1 in the configuration of control circuit 12 and balance resistor units Ra, Rb. Other features in FIG. 5 are similar to those in FIG. 1. Therefore, the same or corresponding components are denoted by the same reference characters, and the description thereof is not repeated.

As shown in FIG. 5, control circuit 12 includes an output node N10 connected to the source of turn-on NMOSFET 14 and an output node N11 connected to the source of turn-off PMOSFET 15. An interconnection N10a branching off from output node N10 connected to the source of turn-on NMOSFET 14 to output a control signal to the control electrode of semiconductor switching device T1a, and an interconnection N10b branching off from output node N10 to output a control signal to the control electrode of semiconductor switching device T1b are arranged. An interconnection N11a branching off from output node N11 connected to the source of turn-off PMOSFET 15 to output a control signal to the control electrode of semiconductor switching device T1a, and an interconnection N11b branching off from output node N11 to output a control signal to the control electrode of semiconductor switching device T1b are arranged. Interconnection N10a and interconnection N11a are connected to the control electrode (gate) of semiconductor switching device T1a. Interconnection N10b and interconnection N11b are connected to the control electrode (gate) of semiconductor switching device T1b. Output node N10 connected to the source of turn-on NMOSFET 14 may be referred to herein as first output node and output node N11 connected to the source of the turn-off PMOSFET may be referred to herein as second output node.

Balance resistor unit Ra includes a resistor element R4a arranged between output node N10 and the gate of semiconductor switching device T1a (i.e., arranged on interconnection N10a), and a diode D3a and a resistor element R3a connected in series with each other and arranged between output node N11 and the gate of semiconductor switching device T1a (i.e., arranged on interconnection N11a). The cathode of diode D3a is connected to output node N11. The order in which diode D3a and resistor element R3a are connected may be reversed with respect to the order shown in FIG. 5. Diode D3a may be connected in series with resistor element R4a. In this case, the cathode of diode D3a is connected to the gate of semiconductor switching device T1a. In this case as well, the order in which diode D3a and resistor element R4a are connected is not limited to a specific order.

Likewise, balance resistor unit Rb includes a resistor element R4b arranged between output node N10 and the gate of semiconductor switching device T1b (i.e., arranged on interconnection N10b), and a diode D3b and a resistor element R3b connected in series with each other and arranged between output node N11 and the gate of semiconductor switching device T1b (i.e., arranged on interconnection N11b). The cathode of diode D3b is connected to output node N11. The order in which diode D3b and resistor element R3b are connected may be reversed with respect to the order shown in FIG. 5. Diode D3b may be connected in series with resistor element R4b. In this case, the cathode of diode D3b is connected to the gate of semiconductor switching device T1b. In this case as well, the order in which diode D3b and resistor element R4b are connected is not limited to a specific order.

[Operation of Power Switching Apparatus 103]

An operation of power switching apparatus 103 in FIG. 5 is described. Power semiconductor modules Ta, Tb have the same circuit configuration and balance resistor units Ra, Rb also have the same circuit configuration, and therefore, turn-on/turn-off of semiconductor switching device T1a occurs almost simultaneously with turn-on/turn-off of semiconductor switching device T1b. In the following, therefore, chiefly an operation of power semiconductor module Ta is described.

In response to switching of external control signal Sg from the L level to the H level, turn-on MOSFET 14 of control circuit 12 switches to the ON state and turn-off MOSFET 15 switches to the OFF state. Accordingly, gate current flows from positive node N2 of first DC power supply 10 to semiconductor switching device T1a through turn-on gate resistor R1, output node 10a, resistor element R4a of balance resistor unit Ra, and internal gate resistor ra of power semiconductor module Ta. As a result, a positive voltage is applied between the gate and the source of first semiconductor switching device T1a to cause semiconductor switching device T1a to be turned on. The turn-on time at this time is determined by the product of the total resistance value of internal gate resistor ra of semiconductor switching device T1a, resistor element R4a of balance resistor unit Ra, and turn-on gate resistor R1, and the gate to source capacitance of semiconductor switching device T1a.

In contrast, in response to switching of external control signal Sg from the H level to the L level, turn-on MOSFET 14 of control circuit 12 switches to the OFF state and turn-off MOSFET 15 switches to the ON state. Accordingly, gate current flows from the gate of semiconductor switching device T1a to ground node GND successively through internal gate resistor ra, resistor element R3a of balance resistor unit Ra, output node N11, and turn-off gate resistor R2. As a result, a negative voltage is applied between the gate and the source of first semiconductor switching device T1a to cause semiconductor switching device T1a to be turned off. The turn-off time at this time is determined by the product of the total resistance value of internal gate resistor ra of semiconductor switching device T1a, resistor element R3a of balance resistor unit Ra, and turn-off gate resistor R2, and the gate to source capacitance of semiconductor switching device T1a.

The above-described configuration provides similar effects to those of the third embodiment, and further enables reduction of the number of components of balance resistor units Ra, Rb relative to the third embodiment. The configuration of balance resistor units Ra, Rb may be replaced with any of respective configurations in the first, second, and third embodiments described in connection with FIGS. 1, 3, and 4.

Fifth Embodiment

[Overall Configuration of Power Switching Apparatus]

Figure 6:
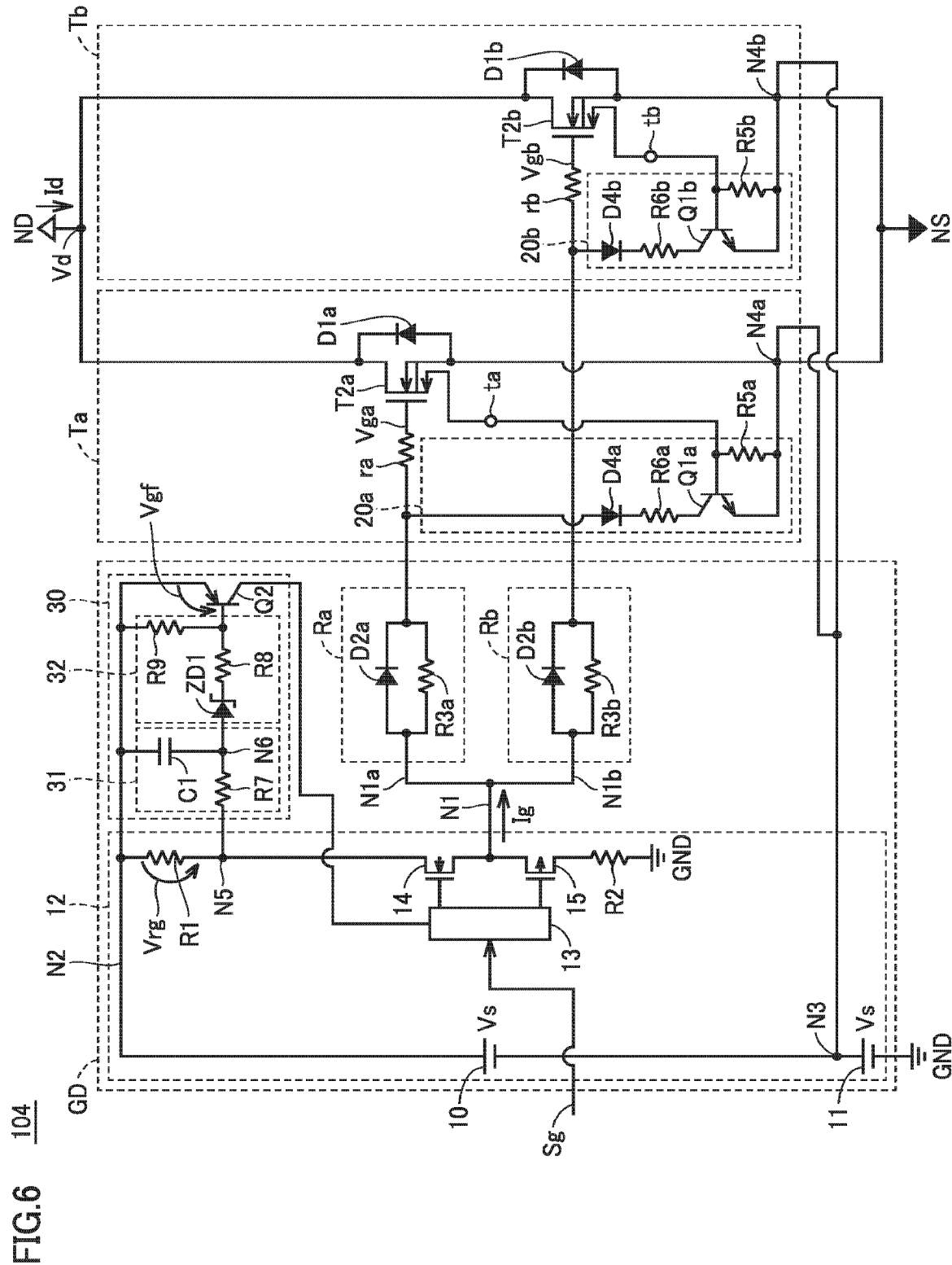
FIG. 6 is a circuit diagram showing a configuration of a combination of power switching apparatus 100 in FIG. 1 with a short-circuit protection circuit.

FIG. 6 is a circuit diagram showing a configuration of a combination of power switching apparatus 100 in FIG. 1 with a short-circuit protection circuit. Semiconductor module Ta in FIG. 6 differs from semiconductor module Ta in FIG. 1 in that the former additionally includes an RTC (Real-Time Current Control) circuit 20a. Semiconductor module Tb in FIG. 6 differs from semiconductor module Tb in FIG. 1 in that the former additionally includes an RTC circuit 20b. In other words, RTC circuit 20 (20a, 20b) is provided for each of semiconductor switching devices T2a, T2b. In semiconductor module Ta in FIG. 6, a semiconductor switching device T2a having a sense terminal to is used. In semiconductor module Tb in FIG. 6, a semiconductor switching device T2b having a sense terminal tb is used.

Drive circuit GD in FIG. 6 differs from drive circuit GD in FIG. 3 in that the former additionally includes an RTC operation determination circuit 30 connected to turn-on gate resistor R1. RTC circuit 20 may be referred to herein as first short-circuit protection circuit and RTC operation determination circuit 30 may be referred to herein as second short-circuit protection circuit.

Other features in FIG. 6 are the same as those in FIG. 1. Therefore, the same or corresponding components are denoted by the same reference characters, and the description thereof is not repeated.

[Configuration and Operation of RTC Circuit]

RTC circuits 20a, 20b each lower the gate to source voltage of associated semiconductor switching device T2a, T2b when the drain current (main circuit current) of associated semiconductor switching device T2a, T2b becomes overcurrent, to thereby reduce the drain current. In this way, semiconductor switching devices T2a, T2b are protected. RTC circuits 20a, 20b have the same circuit configuration and RTC circuit 20a is therefore described in the following.

As shown in FIG. 6, RTC circuit 20a includes a sense resistor R5a, a diode D4a, a resistor element R6a, and an NPN bipolar transistor Q1a. Sense resistor R5a is connected between sense terminal ta and a node N4a connected to the source of semiconductor switching device T2a. The order in which diode D4a and resistor element R6a are connected may be reversed. The base of bipolar transistor Q1a is connected to sense terminal ta of semiconductor switching device T2a.

In RTC circuit 20a having the above-described configuration, when sense current flows through sense terminal ta of semiconductor switching device T2a, a voltage is generated at sense resistor R5a (i.e., the sense current is detected by sense resistor R5a). When the voltage generated at sense resistor R5a exceeds a threshold value, NPN transistor Q1a is turned on. As a result, the gate to source voltage of semiconductor switching device T2a decreases, and therefore, the drain current (main circuit current) of semiconductor switching device T2a is reduced.

RTC circuit 20a in FIG. 6 is merely an example. RTC circuit 20a may more generally be configured in other ways, as long as RTC circuit 20a is configured to include a current detector (R5a) detecting drain current (main circuit current) flowing through the semiconductor switching device, and a determination processor (Q1a) reducing the gate voltage of the semiconductor switching device when the detected drain current is higher than a threshold value.

[Configuration and Operation of RTC Operation Determination Circuit]

RTC operation determination circuit 30 determines whether one (at least one) of RTC circuits 20a, 20b is operating or not. When RTC operation determination circuit 30 determines that one of RTC circuits 20a, 20b is operating, RTC operation determination circuit 30 forcefully blocks the output of control circuit 12 (forces control circuit 12 to output a control signal that causes semiconductor switching device T2a, T2b to be switched to the OFF state). Specifically, RTC operation determination circuit 30 includes a delay circuit 31 (mask circuit), a voltage reduction circuit 32, and a PNP bipolar transistor Q2.

Delay circuit 31 is connected in parallel with turn-on gate resistor R1 and includes a capacitor C1 and a resistor element R7 connected in series with each other. One end of resistor element R7 is connected to a node N5 connected to a low-voltage side of turn-on gate resistor R1.

Voltage reduction circuit 32 includes a Zener diode ZD1 and resistor elements R8, R9. The anode of Zener diode ZD1 is connected to the other end N6 of resistor element R7. Resistor elements R8 and R9 connected in this order are connected between the cathode of Zener diode ZD1 and positive node N2 of DC power supply 10.

The emitter of PNP bipolar transistor Q2 is connected to positive node N2 of DC power supply 10, and the base of transistor Q2 is connected to a connecting node connecting resistor elements R8 and R9. From the collector of transistor Q2, a signal representing a result of determination on operation of RTC circuits 20a, 20b is output to switch control circuit 13.

Figure 7:
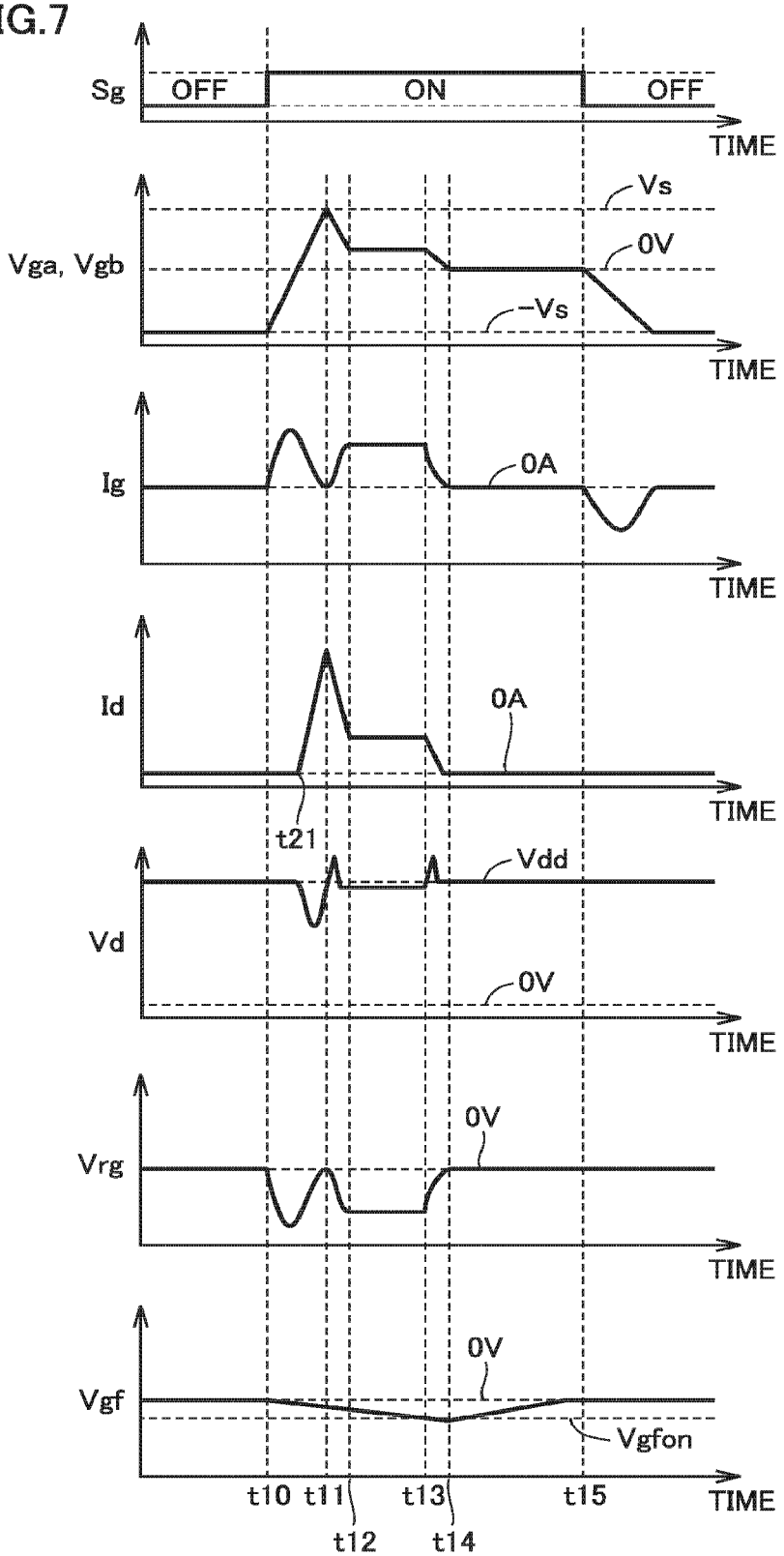
FIG. 7 is a timing chart showing an operation of an RTC operation determination circuit 30 in FIG. 6.

FIG. 7 is a timing chart showing an operation of RTC operation determination circuit 30 in FIG. 6. FIG. 7 shows, successively from the top, external control signal Sg, gate voltages Vga, Vgb of semiconductor switching devices T1a, T1b, control current (gate current) Ig that is output from output node N1 of control circuit 12, drain current Id of semiconductor switching devices T1a, T1b, and drain voltage Vd of semiconductor switching devices T1a, T1b. FIG. 7 further shows voltage Vrg generated at turn-on gate resistor R1 and base to emitter voltage Vgf of transistor Q2. In the following, a description is given of an operation of semiconductor switching device T2a and balance resistor unit Ra when short-circuit current flows. The same is applied as well to semiconductor switching device T2b and balance resistor unit Rb.

Referring to FIGS. 6 and 7, at time t10, external control signal Sg switches from the L level to the H level. In response to this, turn-on MOSFET 14 of control circuit 12 switches to the ON state and turn-off MOSFET 15 switches to the OFF state. Accordingly, gate current flows from positive node N2 of first DC power supply 10 to semiconductor switching device T2a through turn-on gate resistor R1, diode D2a of balance resistor unit Ra, and internal gate resistor ra. As a result, a positive voltage is applied between the gate and the source of first semiconductor switching device T2a. At time t21, semiconductor switching device T2a is turned on.

When short circuit occurs, the load is low and therefore, large drain current Id (main circuit current) flows relative to the drain current in normal operation. At time t11, the voltage generated at resistor element R5a exceeds a threshold voltage, and therefore, transistor Q1a switches to the ON state (RTC circuit 20a switches to the operating state). As a result, gate voltage Vga decreases. Further, as RTC circuit 20a switches to the operating state, gate current Ig keeps flowing still after time t11. While gate current Ig is flowing, capacitor C1 is kept charged, and therefore, the absolute value of base to emitter voltage Vgf of transistor Q2 keeps increasing.

At time t13, gate to emitter voltage Vgf exceeds threshold voltage Vgfon of transistor Q2. Then, transistor Q2 switches to the ON state. Accordingly, a signal that is output from RTC operation determination circuit 30 to switch control circuit 13 and represents a result of determination is activated (rises to the H level). As a result, switch control circuit 13 causes gate voltage Vga to become 0 V at time t14. Further, as the result of determination by RTC operation determination circuit 30 is output to the external circuit, external control signal Sg switches from the H level to the L level at time t15.

An additional description is given below of effects of voltage reduction circuit 32. Threshold voltage Vgfon of transistor Q2 is approximately 0.6 V to 1 V. A problem arising from this is as follows. In order for the absolute value of gate voltage Vgf of transistor Q2 not to exceed the absolute value of threshold voltage Vgfon at the turn-on time (from time t0 to time t3 in FIG. 2) in normal operation, the time constant of delay circuit 31 must be set to a relatively large value.

In the circuit shown in FIG. 6 including voltage reduction circuit 32, gate voltage Vgf of transistor Q2 at the time of turn-on is equal to a voltage determined by subtracting a Zener voltage of Zener diode ZD1 from a voltage of capacitor C1 and dividing the determined difference by resistor elements R8, R9. In other words, the absolute value of gate voltage Vgf of transistor Q2 is smaller than the one when no voltage reduction circuit 32 is provided. As a result, the time constant of delay circuit 31 can be set to a relatively small value, and therefore, short-circuit protective operation can be made faster.

Voltage reduction circuit 32 is not necessarily a requisite component. Specifically, RTC operation determination circuit 30 at least includes delay circuit (mask circuit) 31 that outputs a voltage determined by delaying a change of a terminal to terminal voltage of turn-on gate resistor R1, and a determination circuit (Q2) determining that the RTC circuit is operating when the output voltage of delay circuit 31 exceeds a threshold value.

[Operation of Power Switching Apparatus 104]

An operation of the power switching apparatus is described, including an operation of the short-circuit protection circuit.

Figure 8:
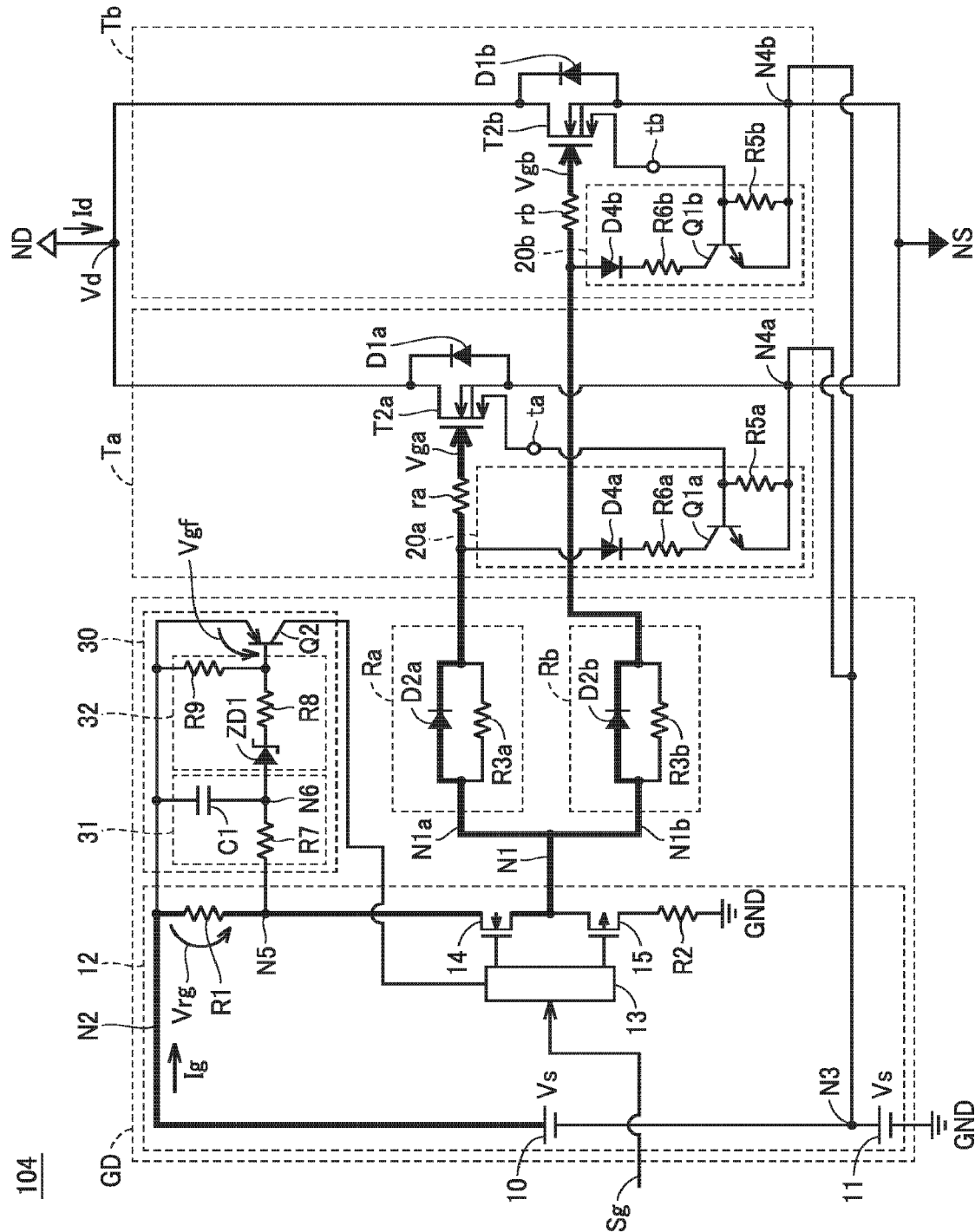
FIG. 8 is a diagram showing a path for gate current Ig in a normal operation of power switching apparatus 104 in FIG. 6.
Figure 9:
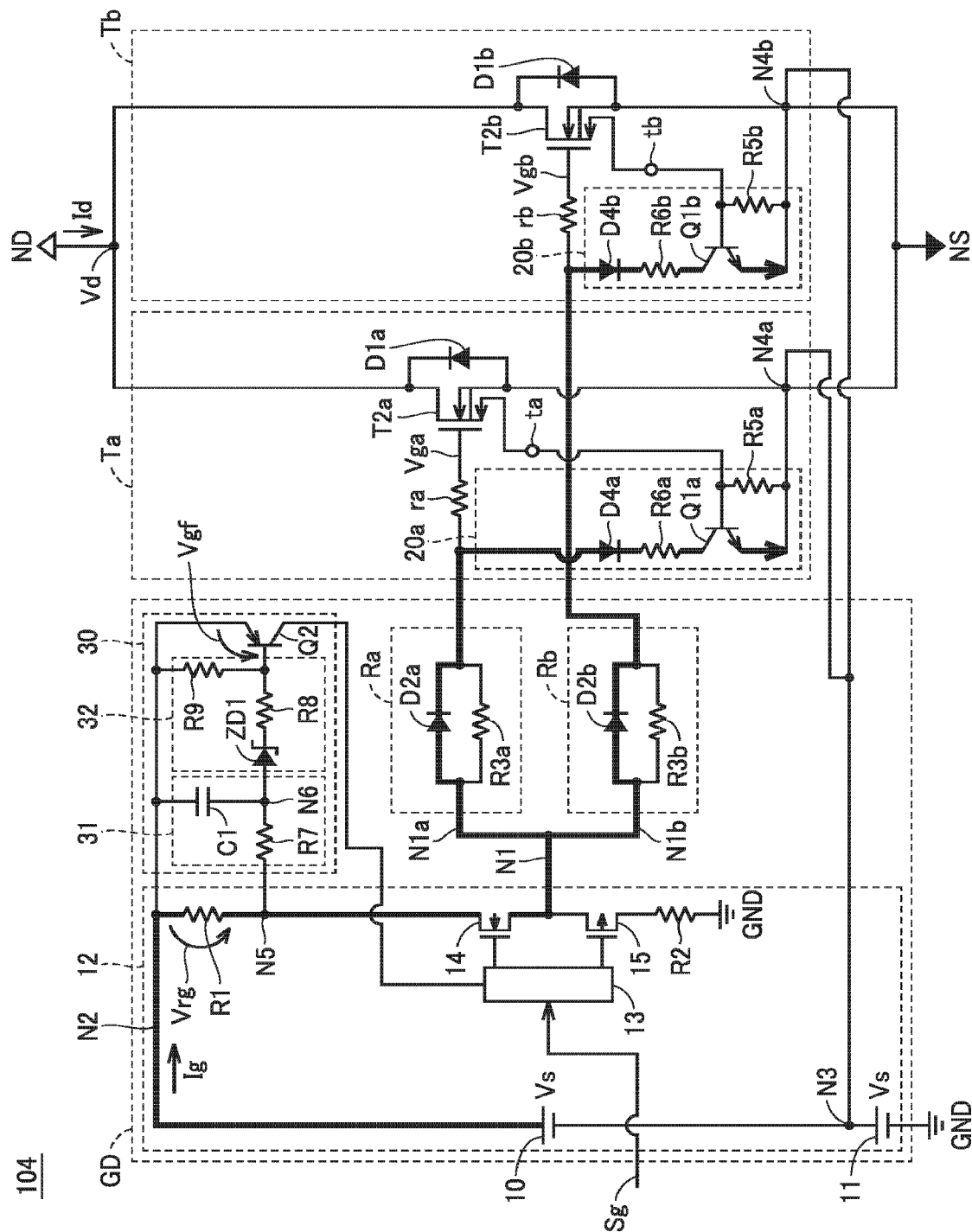
FIG. 9 is a diagram showing a path for gate current Ig in a short-circuit operation of power switching apparatus 104 in FIG. 6.

FIG. 8 is a diagram showing a path for gate current Ig in a normal operation of power switching apparatus 104 in FIG. 6. FIG. 9 is a diagram showing a path for gate current Ig in a short-circuit operation of power switching apparatus 104 in FIG. 6. In FIGS. 8 and 9, the paths for gate current Ig are indicated by bold lines.

Referring to FIG. 8, the normal operation where no short circuit occurs is described. In the normal operation, NPN transistors Q1a, Q1b are in the OFF state, and therefore, RTC circuits 20a, 20b do not operate. At the time of turn-on in the normal operation, gate current Ig flows as shown in FIG. 8 only during a period in which input capacitors of semiconductor switching devices T2a, T2b are charged, and a voltage is generated across turn-on gate resistor R1. In order to prevent PNP transistor Q2 from being turned on at this time, RTC operation determination circuit 30 includes delay circuit 31 (mask circuit) formed by capacitor C1 and resistor R7. Delay circuit 31 delays rising of the voltage generated across resistor R9, and therefore, transistor Q2 is kept in the OFF state.

Referring to FIG. 9, the short-circuit operation is described. When the main circuit is short-circuited due to malfunction for example of switch control circuit 13 to cause main circuit current of semiconductor module Ta and main circuit current of semiconductor module Tb to become overcurrent simultaneously, current flowing from each of sense terminals ta, tb of semiconductor switching devices T2a, T2b also increases in proportion to the main circuit current. As a result, voltages generated at sense resistors Rya, R5b increase to thereby cause the base to emitter voltages of NPN transistors Q1a, Q1b to increase. When the base to emitter voltage exceeds a threshold voltage of each of NPN transistors Q1a, Q1b, NPN transistors Q1a, Q1b are turned on.

As a result, as shown in FIG. 9, gate current Ig flows successively through turn-on gate resistor R1, diode D2a of balance resistor unit Ra, and diode D4a and resistor element R6a in RTC circuit 20a. Further, gate current Ig flows successively through turn-on gate resistor R1, diode D2b of balance resistor unit Rb, and diode D4b and resistor R6b in RTC circuit 20b. Further, as NPN transistors Q1a, Q1b are turned on, the gate to source voltages of semiconductor switching devices T2a, T2b decrease, and accordingly main circuit current Id is reduced.

At this time, the gate to source voltage of semiconductor switching device T2a is equal to a voltage generated at resistor element R6a. The voltage at resistor element R6a is a voltage determined by dividing power supply voltage Vs by a resistance value of turn-on gate resistor R1 and a half of a resistance value of resistor element R6a. Likewise, the gate to source voltage of semiconductor switching device T2b is equal to a voltage generated at resistor element R6b. The voltage at resistor element R6b is a voltage determined by dividing power supply voltage Vs by a resistance value of turn-on gate resistor R1 and a half of a resistance value of resistor element R6b. The resistance value of resistor element R6a and the resistance value of resistor element R6b described above are equal to each other. The resistance values of balance resistor units Ra, Rb are negligible because they are equal to the resistance values at the time of turn-on in the normal operation, i.e., the on resistances of diodes D2a, D2b.

After the operation of the RTC circuit, gate current Ig still keeps flowing, and therefore, a voltage is kept generated at turn-on gate resistor R1. The voltage generated at turn-on gate resistor R1 is a voltage determined by dividing power supply voltage Vs by a resistance value of turn-on gate resistor R1 and a half of a resistance value of resistor element R6a. As a result, when a voltage generated at resistor element R9 exceeds an operational threshold voltage of PNP transistor Q2, PNP transistor Q2 is turned on. As a result, switch control circuit 13 forcefully blocks external control signal Sg.

The voltage at resistor element R9 has a value depending on the voltage at turn-on gate resistor R1. Therefore, the voltage divider ratio determined by turn-on gate resistor R1 and resistor R6a of RTC circuit 20a influences the operational accuracy of RTC operation determination circuit 30. In the case for example of the configuration of the conventional art in which diodes D2a, D2b are not provided in balance resistor units Ra, Rb, increase of the resistance values of balance resistor units Ra, Rb with the purpose of suppressing parasitic oscillation during turn-off results in decrease of the voltage generated across turn-on gate resistor R1. Due to this, operation of RTC operation determination circuit 30 is slowed. In the worst case, the RTC operation determination circuit may not operate when short circuit occurs. In contrast, in the configuration of the present embodiment, even when the resistance values of balance resistor units Ra, Rb (i.e., resistance values of resistor elements R3a, R3b) at the time of turn-off are increased with the purpose of suppressing parasitic oscillation, the value of turn-on gate resistor R1 is not influenced. As a result, the voltage generated across turn-on gate resistor R1 after operation of RTC circuits 20a, 20b is kept constant regardless of the values of resistor elements R3a, R3b of the balance resistor units. Accurate operation of RTC operation determination circuit 30 is therefore possible.

As seen from the above, power switching apparatus 104 in the present embodiment provides similar effects to those in the first embodiment, and enables RTC operation determination circuit 30 to operate correctly when short circuit occurs.

Sixth Embodiment

[Configuration of Power Switching Apparatus 105]

Figure 10:
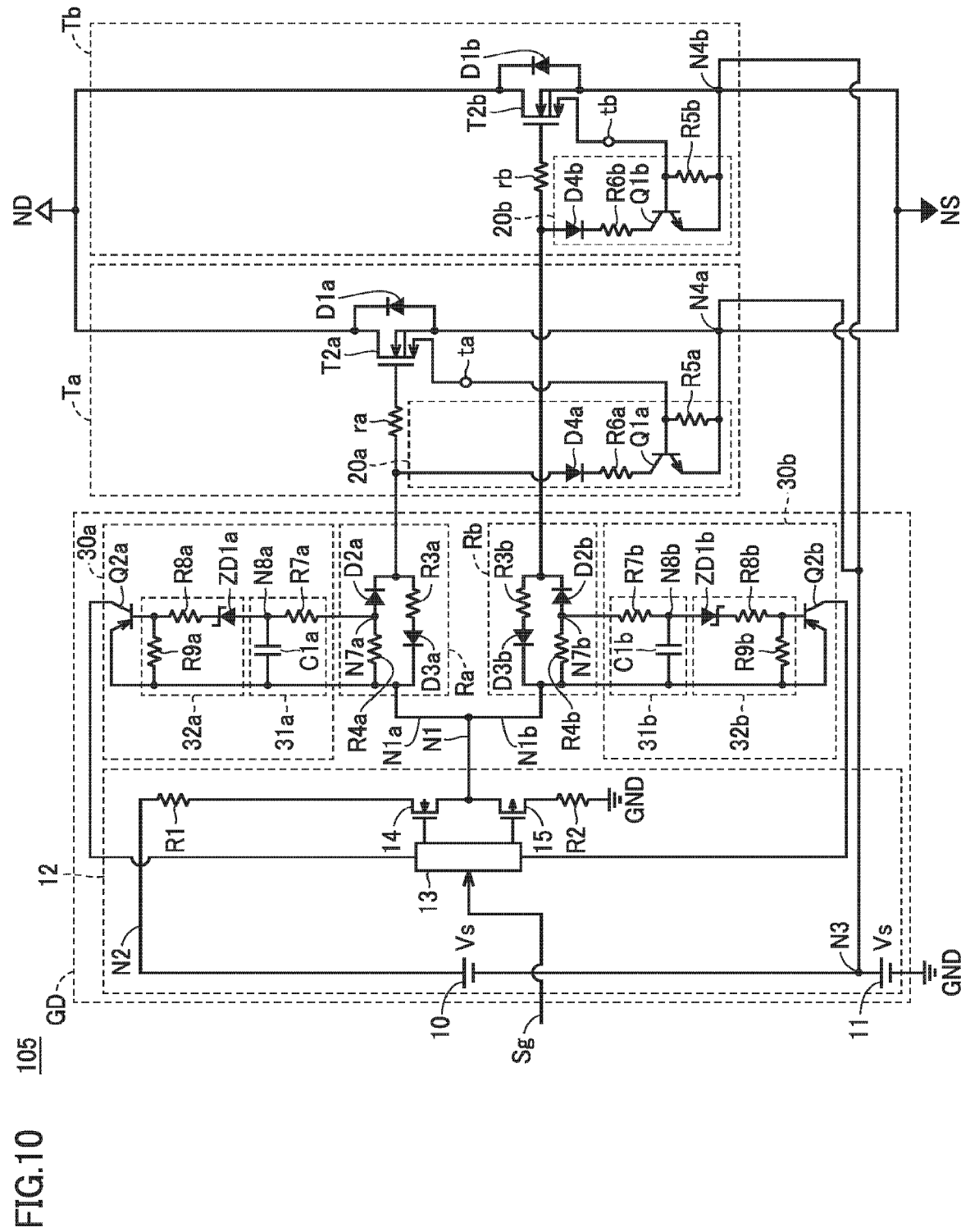
FIG. 10 is a circuit diagram showing a configuration of a combination of power switching apparatus 102 in FIG. 4 with a short-circuit protection circuit.

FIG. 10 is a circuit diagram showing a configuration of a combination of power switching apparatus 102 in FIG. 4 with a short-circuit protection circuit. Semiconductor modules Ta, Tb in FIG. 10 differ from semiconductor module Ta in FIG. 4 in that the former modules Ta, Tb further include respective RTC circuits 20a, 20b. The example configuration of RTC circuits 20a, 20b is the same as the one described in connection with FIG. 6. The description thereof is therefore not repeated.

In addition, in semiconductor module Ta in FIG. 10, a semiconductor switching device T2a having a sense terminal to is used and, in semiconductor module Tb, a semiconductor switching device T2b having a sense terminal tb is used.

Drive circuit GD in FIG. 10 differs from drive circuit GD in FIG. 4 in that the former further includes an RTC operation determination circuit 30a connected to resistor element R4a of balance resistor unit Ra and an RTC operation determination circuit 30b connected to resistor element R4b of balance resistor unit Rb. The configuration of RTC operation determination circuits 30a, 30b is the same as that of RTC operation determination circuit 30 described in connection with FIG. 6. Therefore, these RTC operation determination circuits are denoted by the same reference character as RTC operation determination circuit 30 in FIG. 6 except for suffixes "a" and "b" and the description thereof is not repeated. Suffixes "a" and "b" indicate that the associated components correspond to RTC operation determination circuits 30a, 30b, respectively. RTC operation determination circuits 30a, 30b may be connected to the opposite ends of associated balance resistor units Ra, Rb.

Other features in FIG. 10 are the same as those in FIG. 4. Therefore, the same or corresponding components are denoted by the same reference characters, and the description thereof is not repeated.

[Operation of Power Switching Apparatus 105]

A description is given of a short-circuit protection operation when semiconductor switching device T2a, which is one of parallel-connected semiconductor switching devices T2a, T2b, is short-circuited due to a certain failure.

Figure 11:
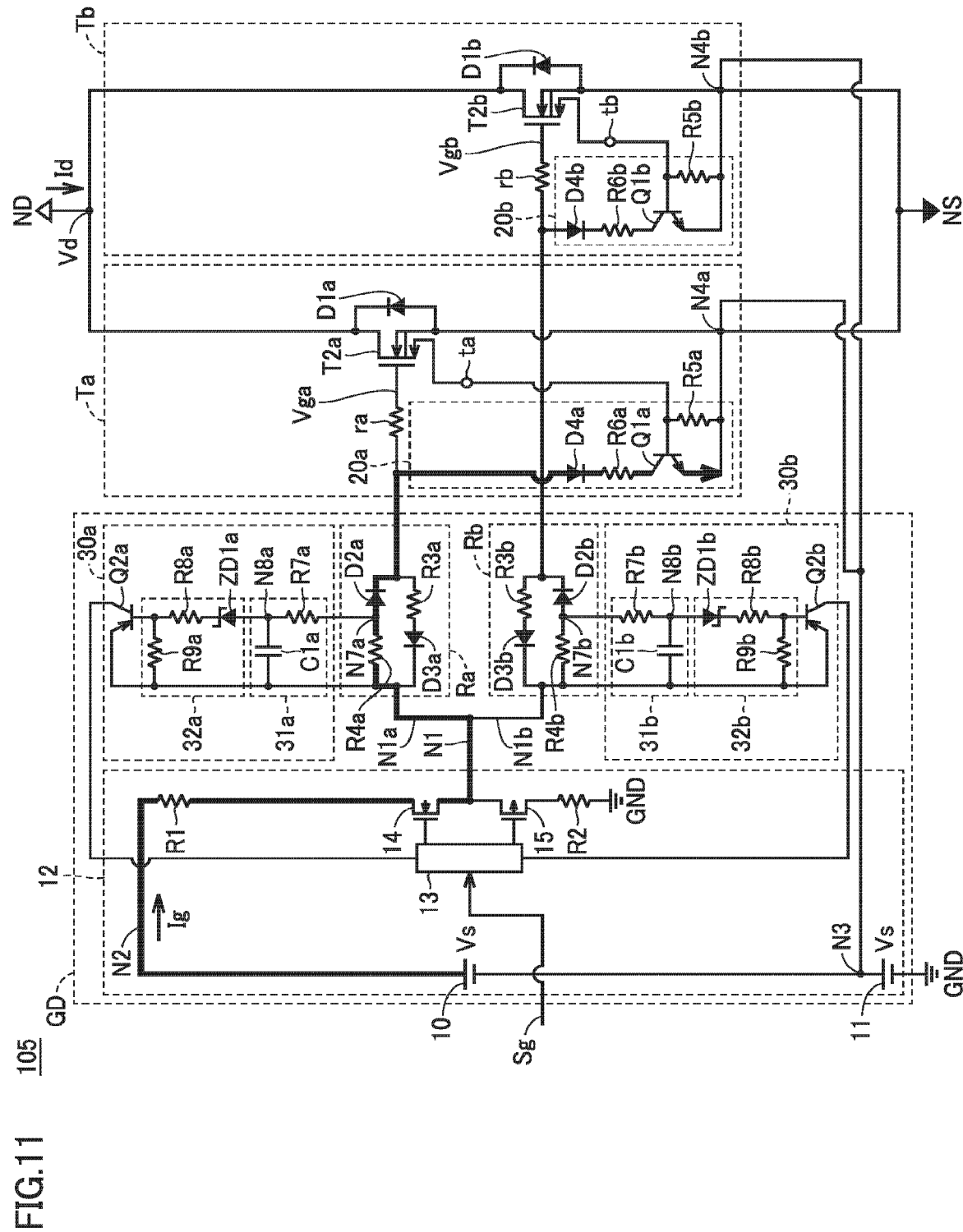
FIG. 11 is a diagram showing a path for gate current Ig when a semiconductor switching device T2a in a power switching apparatus 105 in FIG. 10 fails due to short circuit.

FIG. 11 is a diagram showing a path for gate current Ig when semiconductor switching device T2a in power switching apparatus 105 in FIG. 10 fails due to short circuit. In FIG. 11, the path for gate current Ig is indicated by a bold line.

When semiconductor switching device T2a is short-circuited due to a certain failure, sense current flowing from sense terminal to of semiconductor switching device T2a increases in proportion to main current between main electrodes. Then, when a voltage generated at sense resistor Rya, i.e., the base to emitter voltage of NPN transistor Q1a exceeds a threshold voltage, NPN transistor Q1a is turned on. As a result, as shown in FIG. 11, gate current Ig flows successively through turn-on gate resistor R1, resistor element R4a and diode D2a of balance resistor unit Ra, and diode D4a and resistor element R6a in RTC circuit 20a. As NPN transistor Q1a is turned on, the gate to source voltage of semiconductor switching device T2a decreases, and accordingly main current Id is reduced.

At this time, the gate to source voltage of semiconductor switching device T2a is equal to the voltage generated at resistor element R6a. The voltage at resistor element R6a is a voltage determined by dividing power supply voltage Vs by the resistance value of turn-on gate resistor R1, the resistance value of resistor element R4a of balance resistor unit Ra, and the resistance value of resistor element R6a.

After the operation of RTC circuit 20a, gate current Ig still keeps flowing, and therefore, the voltage is kept generated across resistor element R4a of balance resistor unit Ra. The voltage across resistor element R4a of balance resistor unit Ra is a voltage determined by dividing power supply voltage Vs by a resistance value of turn-on gate resistor R1, a resistance value of resistor element R4a of balance resistor unit Ra, and a resistance value of resistor element R6a. As a result, when a voltage across resistor element R9a exceeds an operational threshold voltage of PNP transistor Q2a, PNP transistor Q2a is turned on. As a result, switch control circuit 13 forcefully blocks external control signal Sg.

The voltage across resistor element R9a has a value depending on the voltage at resistor element R4a of balance resistor unit Ra. Therefore, the voltage divider ratio determined by turn-on gate resistor R1, resistor element R4a of balance resistor unit Ra, and resistor R6a of RTC circuit 20a influences the operational accuracy of RTC operation determination circuit 30a. In the case of the present embodiment, the resistance value of balance resistor unit Ra at the time of turn-on and in the short-circuit operation is determined by the resistance value of resistor element R4a, and the resistance value of balance resistor unit Ra at the time of turn-off is determined by the resistance value of resistor element R3a. In other words, the resistance value of balance resistor unit Ra at the time of turn-on is not influenced by the resistance value of balance resistor unit Ra at the time of turn-off. It is therefore possible to reduce the resistance value of turn-on gate resistor R1 and increase the resistance value of resistor element R4a of balance resistor unit Ra. As a result, the voltage at resistor R4a of balance resistor unit Ra after the operation of RTC circuit 20a can be set relatively large to cause RTC operation determination circuit 30a to operate accurately.

The circuit configuration of balance resistor unit Ra is the same as the circuit configuration of balance resistor unit Rb, and the circuit configuration of semiconductor module Ta is the same as the circuit configuration of semiconductor module Tb. Therefore, when semiconductor switching device T2b fails due to short circuit, short-circuit protection can be performed speedily and accurately in a similar manner to the above-described one. Further, the resistance values of resistor elements R4a, R4b of balance resistor units Ra, Rb can be increased to achieve the effect of suppressing parasitic oscillation during switching that occurs when semiconductor switching devices are connected in parallel.

It is supposed that, in the fifth embodiment (power switching apparatus 104 in FIG. 6), only semiconductor switching device T2a is short-circuited due to a certain failure and only RTC circuit 20a operates. In this case, the voltage across turn-on gate resistor R1 is a voltage determined by dividing power supply voltage Vs by the resistance value of turn-on gate resistor R1 and the resistance value of resistor element R6a. Therefore, the operational accuracy of RTC operation determination circuit 30 is lowered relative to the case where short-circuit current flows through semiconductor switching devices T2a, T2b simultaneously. In contrast, the present embodiment sets the resistance value of turn-on gate resistor R1 to 0Ω. Accordingly, in both the case where one of semiconductor switching devices T2a, T2b is short-circuited and the case where both are short-circuited simultaneously, the voltage of resistor element R4a after the operation of the RTC circuit is equal to the voltage determined by dividing power supply voltage Vs by the resistance value of resistor element R4a of balance resistor unit Ra and the resistance value of resistor element R6b. It is therefore possible to cause RTC operation determination circuit 30a to operate correctly with the same accuracy in both the cases.

Effects of Sixth Embodiment

As seen from the above, when short-circuit current flows through at least one of semiconductor switching devices T2a, T2b in power switching apparatus 105 in the present embodiment, it is possible to cause RTC operation determination circuits 30a, 30b to operate correctly. As a result, fast and correct short-circuit protection is achieved.

In the fifth embodiment, as the number of parallel-connected semiconductor switching devices T2a, T2b, . . . is larger, the lower the operational accuracy of the RTC operation determination circuit when any one of the semiconductor switching devices is short-circuited due to a certain failure. In contrast, in the present embodiment, even when the number of parallel-connected semiconductor switching devices T2a, T2b, is larger, the operational accuracy of RTC operation determination circuits 30a, 30b, remains the same. The present embodiment is therefore effective particularly when the number of parallel-connected semiconductor switching devices is large.

RTC operation determination circuits 30a, 30b in the present embodiment can each be connected to the opposite ends of associated balance resistor unit Ra, Rb or associated resistor element R4a, R4b described in connection with FIG. 3. RTC operation determination circuits 30a, 30b in the present embodiment can each be connected also to the opposite ends of associated balance resistor unit Ra, Rb or associated resistor element R4a, R4b described in connection with FIG. 5.

Seventh Embodiment

[Configuration of Power Switching Apparatus 106]

Figure 12:
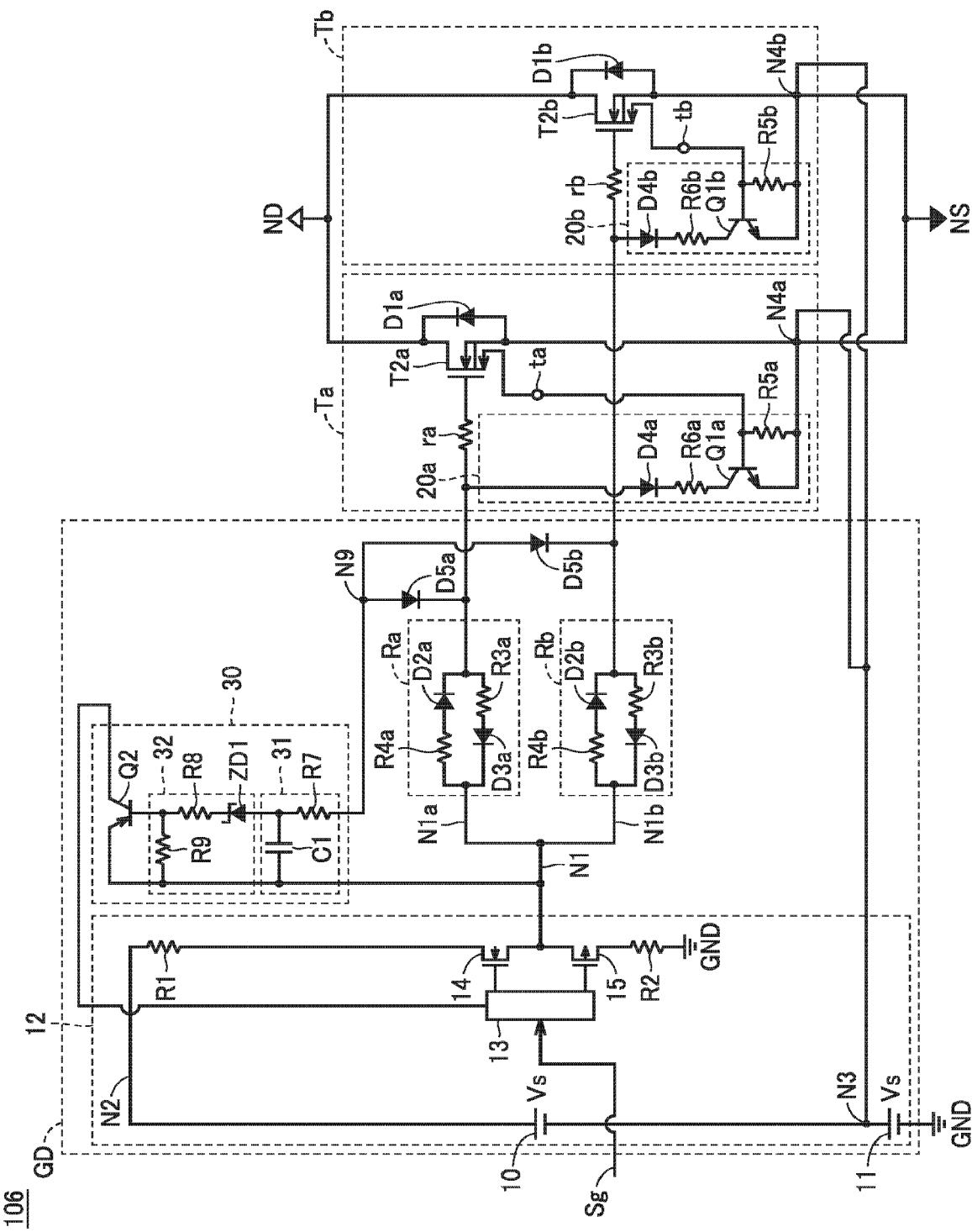
FIG. 12 is a circuit diagram showing a configuration of a modification of the combination of power switching apparatus 102 in FIG. 4 with a short-circuit protection circuit.

FIG. 12 is a circuit diagram showing a configuration of a modification of the combination of power switching apparatus 102 in FIG. 4 with a short-circuit protection circuit. Semiconductor modules Ta, Tb in FIG. 12 differ from semiconductor module Ta in FIG. 4 in that the former semiconductor modules Ta, Tb further include RTC circuits 20a, 20b, respectively. An example configuration of RTC circuits 20a, 20b is the same as the one described in connection with FIG. 6. Therefore, the description thereof is not repeated.

Further, for semiconductor module Ta in FIG. 12, a semiconductor switching device T2a having a sense terminal to is used and, for semiconductor module Tb in FIG. 12, a semiconductor switching device T2b having a sense terminal tb is used.

Drive circuit GD in FIG. 12 further includes diodes D5a, D5b. The cathode of diode D5a is connected to a connecting line connecting balance resistor unit Ra to the gate of semiconductor switching device T2a. The cathode of diode D5b is connected to a connecting line connecting balance resistor unit Rb to the gate of semiconductor switching device T2b. The anode of diode D5a and the anode of diode D5b are connected to a common connection node N9.

RTC operation determination circuit 30 is connected between output node N1 of control circuit 12 and connection node N9. The configuration of RTC operation determination circuit 30 is the same as the one described in connection with FIG. 6. Specifically, RTC operation determination circuit 30 includes delay circuit 31 (mask circuit), voltage reduction circuit 32, and PNP bipolar transistor Q2. Delay circuit 31 includes capacitor C1 and resistor element R7 connected in series between output node N1 and connection node N9 (capacitor C1 is connected so that the distance from capacitor C1 to output node N1 is shorter than the distance from resistor element R7 to output node N1).

Other features in FIG. 12 are the same as those in FIG. 4. Therefore, the same or corresponding components are denoted by the same reference characters, and the description thereof is not repeated. The configuration of balance resistor units Ra, Rb and the configuration of control circuit 12 in FIG. 12 may be any of modifications of FIG. 1 and configurations in FIGS. 3 and 5. When the present embodiment is combined with the configuration in FIG. 5, RTC operation determination circuit 30 is connected between output node N10 of control circuit 12 and connection node N9. Connection node N9 may be referred to herein as first connection node.

[Operation of Power Switching Apparatus 106]

A description is given of a short-circuit protection operation when semiconductor switching device T2a, which is one of parallel-connected semiconductor switching devices T2a, T2b, is short-circuited due to a certain failure.

Figure 13:
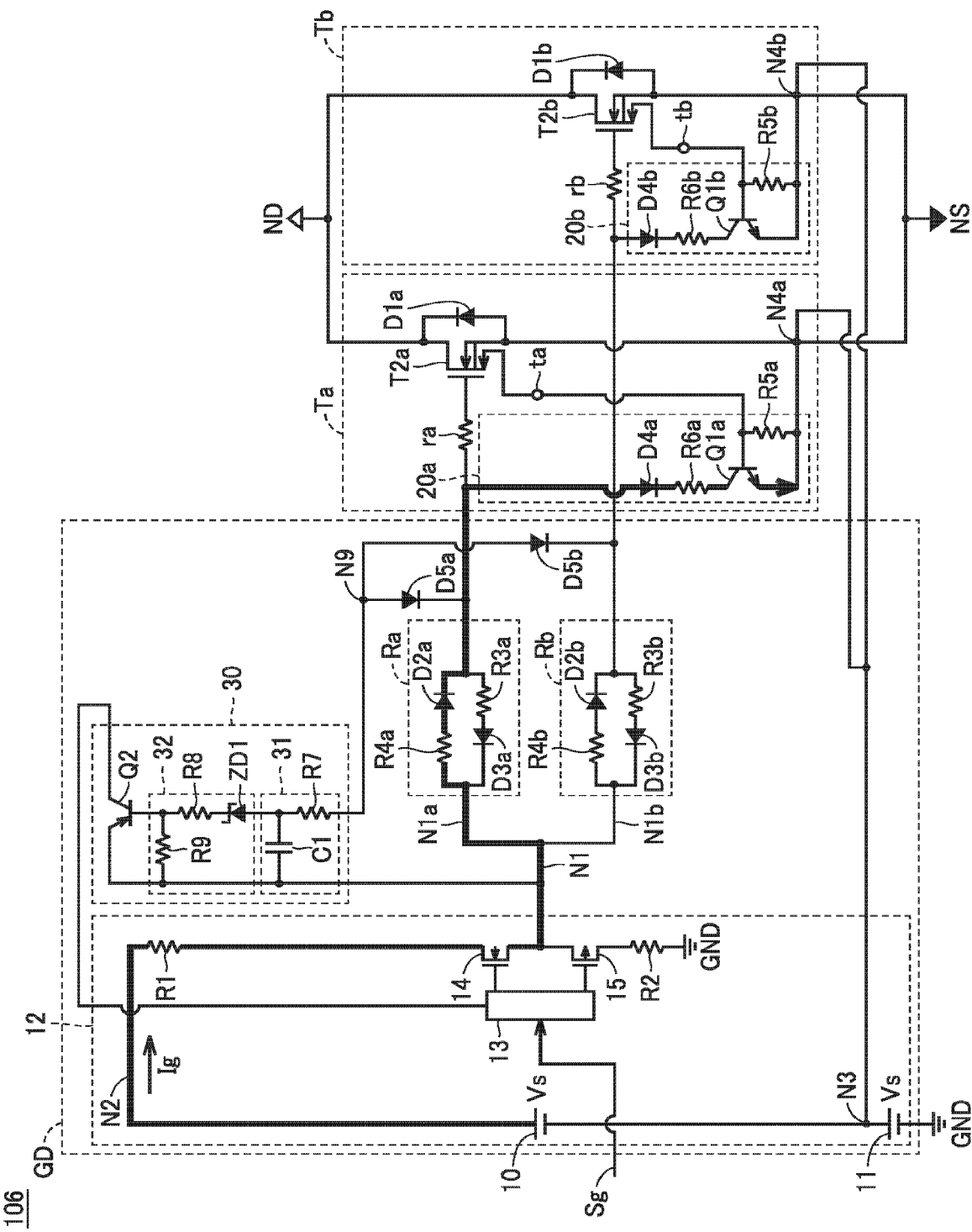
FIG. 13 is a diagram showing a path for gate current Ig when only a semiconductor switching device T2a in a power switching apparatus 106 in FIG. 12 fails due to short circuit.

FIG. 13 is a diagram showing a path for gate current Ig when semiconductor switching device T2a in power switching apparatus 106 in FIG. 12 fails due to short circuit. In FIG. 13, the path for gate current Ig is indicated by a bold line.

When semiconductor switching device T2a is short-circuited due to a certain failure, sense current flowing from sense terminal to of semiconductor switching device T2a increases in proportion to main current between main electrodes. Then, when the voltage across sense resistor Rya, i.e., the base to emitter voltage of NPN transistor Q1a exceeds a threshold voltage, NPN transistor Q1a is turned on. As a result, as shown in FIG. 13, gate current Ig flows successively through turn-on gate resistor R1, resistor element R4a of balance resistor unit Ra, and diode D4a and resistor element R6a in RTC circuit 20a. As NPN transistor Q1a is turned on, the gate to source voltage of semiconductor switching device T2a decreases, and accordingly main current Id is reduced.

At this time, the gate to source voltage of semiconductor switching device T2a is equal to the voltage generated at resistor element R6a. The voltage at resistor element R6a is a voltage determined by dividing power supply voltage Vs by the resistance value of turn-on gate resistor R1, the resistance value of resistor element R4a of balance resistor unit Ra, and the resistance value of resistor element R6a.

After the operation of RTC circuit 20a, gate current Ig still keeps flowing, and therefore, the voltage is kept generated across turn-on gate resistor R1. The voltage across turn-on gate resistor R1 is a voltage determined by dividing power supply voltage Vs by a resistance value of turn-on gate resistor R1, a resistance value of resistor element R4a of balance resistor unit Ra, and a resistance value of resistor element R6a. As a result, when a voltage generated at resistor element R9 exceeds an operational threshold voltage of PNP transistor Q2, PNP transistor Q2 is turned on. As a result, switch control circuit 13 forcefully blocks external control signal Sg.

The voltage across resistor element R9 has a value depending on the voltage at resistor element R4a of balance resistor unit Ra. Therefore, the voltage divider ratio determined by turn-on gate resistor R1, resistor element R4a of balance resistor unit Ra, and resistor R6a of RTC circuit 20a influences the operational accuracy of RTC operation determination circuit 30. In the case of the present embodiment, the resistance value of balance resistor unit Ra at the time of turn-on and in the short-circuit operation is determined by the resistance value of resistor element R4a, and the resistance value of balance resistor unit Ra at the time of turn-off is determined by the resistance value of resistor element R3a. In other words, the resistance value of balance resistor unit Ra at the time of turn-on is not influenced by the resistance value of balance resistor unit Ra at the time of turn-off. It is therefore possible to increase the resistance value of resistor element R4a of balance resistor unit Ra and decrease the resistance value of turn-on gate resistor R1. As a result, the voltage at resistor R4a of balance resistor unit Ra after the operation of RTC circuit 20a can be set relatively large to cause RTC operation determination circuit 30 to operate accurately.

The circuit configuration of balance resistor unit Ra is the same as the circuit configuration of balance resistor unit Rb, and the circuit configuration of semiconductor module Ta is the same as the circuit configuration of semiconductor module Tb. Therefore, when semiconductor switching device T2b fails due to short circuit, short-circuit protection can be performed speedily and accurately in a similar manner to the above-described one. Further, the resistance values of resistor elements R4a, R4b of balance resistor units Ra, Rb can be increased to suppress parasitic oscillation during switching that occurs when semiconductor switching devices are connected in parallel.

It is supposed that, in the fifth embodiment (power switching apparatus 104 in FIG. 6), only semiconductor switching device T2a is short-circuited due to a certain failure and only RTC circuit 20a operates. In this case, the voltage across turn-on gate resistor R1 is a voltage determined by dividing power supply voltage Vs by the resistance value of turn-on gate resistor R1 and the resistance value of resistor element R6a. Therefore, the operational accuracy of RTC operation determination circuit 30 is lowered relative to the case where short-circuit current flows through semiconductor switching devices T2a, T2b simultaneously. In contrast, the present embodiment sets the resistance value of turn-on gate resistor R1 to 0Ω. Accordingly, in both the case where one of semiconductor switching devices T2a, T2b is short-circuited and the case where both are short-circuited simultaneously, the voltage of resistor element R4a after the operation of the RTC circuit is equal to the voltage determined by dividing power supply voltage Vs by the resistance value of resistor element R4a of balance resistor unit Ra and the resistance value of resistor element R6b. It is therefore possible to cause RTC operation determination circuit 30a to operate correctly with the same accuracy in both the cases.

Effects of Seventh Embodiment

Power switching apparatus 106 in the present embodiment provides similar effects to those in the sixth embodiment. While the sixth embodiment requires the same number of RTC operation determination circuits as the number of parallel-connected semiconductor switching devices, the present embodiment requires one RTC operation determination circuit regardless of the number of parallel-connected semiconductor switching devices, and therefore can suppress increase of the cost due to increase of the number of components and/or increase of the control circuit area.

<Modifications Common to the Embodiments>

Instead of turn-on MOSFET 14 and turn-off MOSFET 15 forming gate drive circuit GD, bipolar transistors may be used. MOSFETs employed as semiconductor switching devices T1a, T1b forming semiconductor modules Ta, Tb may be replaced with IGBTs (Insulated Gate Bipolar Transistors). While two semiconductor switching devices T1a, T1b are connected in parallel, three or more semiconductor switching devices may be connected in parallel.

The material for semiconductor switching devices T1a, T1b is not limited to Si (silicon), but may be wide-bandgap semiconductor such as SiC (silicon carbide), GaN (gallium nitride), and C (diamond). The wide-bandgap semiconductor switching device is suitable for fast switching. In the case where no diode is provided in balance resistor units Ra, Rb like the conventional art, not only the turn-off resistance value but also the turn-on resistance value increases and therefore not only turn-off loss but also turn-on loss increases. In such a case, the fast switching devices of wide-bandgap semiconductor elements are not effectively used. In contrast, balance resistor units Ra, Rb may be configured as shown in FIGS. 1, 3, 4, and 5 to suppress parasitic oscillation occurring during switching operation, without increasing the loss involved in any one of turn-on switching operation and turn-off switching operation. Therefore, the expensive wide-bandgap semiconductor elements are not broken. The characteristics of the wide-bandgap semiconductor element suitable for fast switching can thus be utilized effectively.

<Other Applications>

The power switching apparatus in each embodiment may also be applied to suppress radiation noise due to large voltage variation dV/dt and current variation dI/dt between the drain and the source of semiconductor switching devices T1a, T1b. Specifically, when radiation noise occurring upon turn-off is a problem to be solved, any of the configurations shown in FIGS. 1, 3, 4, and 5 can be used as a configuration of balance resistor units Ra, Rb to limit radiation noise occurring upon turn-off without increasing the turn-on loss. On the contrary, when radiation noise occurring upon turn-on is a problem to be solved, the configuration in FIGS. 1 and 3 where the polarity of the diodes is opposite can be employed as a configuration of balance resistor units Ra, Rb, or an appropriate resistance value of resistor element R4a in FIG. 4 may be determined or an appropriate value of resistor element R4a in FIG. 5 may be determined, to thereby limit radiation noise upon turn-on without increasing the turn-off loss.

It should be construed that embodiments disclosed herein are given by way of illustration in all respects, not by way of limitation. It is intended that the scope of the present invention is defined by claims, not by the description above, and encompasses all modifications and variations equivalent in meaning and scope to the claims.

REFERENCE SIGNS LIST 10 first DC power supply; 11 second DC power supply; 12 control circuit; 13 switch control circuit; 20, 20a, 20b RTC circuit; 30, 30a, 30b RTC operation determination circuit; 31 delay circuit; 32 voltage reduction circuit; 100-104 power switching apparatus; GD drive circuit; Id drain current (main current); Ig gate current; N1 output node; N2 positive node; N3 connection node; ND high-voltage side node; NS low-voltage side node; Ra, Rb balance resistor unit; Sg external control signal; T1a, T1b, T2a, T2b semiconductor switching device; Ta, Tb semiconductor module

The invention claimed is:

1. A power switching apparatus comprising:
   a plurality of semiconductor switching devices connected in parallel with each other, the semiconductor switching devices each including a first main electrode, a second main electrode and a control electrode;
   a control circuit including:
     at least one output node to output a control signal for turning on and turning off each of the semiconductor switching devices;
     a first resistor element to adjust a turn-on switching speed of each of the semiconductor switching devices; and
     a second resistor element to adjust a turn-off switching speed of each of the semiconductor switching devices;
   a plurality of balance resistor units each associated with a respective one of the plurality of semiconductor switching devices and connected between the control electrode of the associated semiconductor switching device and the at least one output node,
     the balance resistor units each being configured to suppress parasitic oscillation between the semiconductor switching devices, the parasitic oscillation occurring during at least one of turn-on and turn-off of the semiconductor switching devices,
     the balance resistor units each being configured to have a resistance value switched between different values depending on whether the semiconductor switching devices are turned on or turned off in accordance with the control signal;
   a plurality of first protection circuits each:
     associated with a respective one of the plurality of semiconductor switching devices; and
     reducing a voltage between the control electrode and the first main electrode of the associated semiconductor switching device when detecting overcurrent flowing between the first main electrode and the second main electrode of the associated semiconductor switching device; and
   a second protection circuit configured to:
     detect current flowing through an interconnection provided for supplying the control signal;
     determine, based on the detected current, whether at least one of the plurality of first protection circuits is in operating state; and
     when an associated protection circuit of the plurality of first protection circuits is in operating state, change the control signal for causing each of the semiconductor switching devices to be turned off.

2. The power switching apparatus according to claim 1, wherein
   the control circuit includes a first output node as the at least one output node,
   the balance resistor units each include:
     a first rectifying element connected between the first output node of the control circuit and the control electrode of the associated semiconductor switching device; and
     a third resistor element connected in parallel with the first rectifying element, the first rectifying element has an anode connected directly to the first output node of the control circuit,
   the control circuit includes:
     a first switching element connected between a power supply node and the first output node of the control circuit; and
     a second switching element connected between a ground node and the first output node,
   the first resistor element is connected in series with the first switching element between the power supply node and the first output node,
   when the first switching element is in ON state and the second switching element is in OFF state, the control circuit outputs the control signal from the first output node for switching each of the semiconductor switching devices to ON state, and
   the second protection circuit determines, based on a voltage generated at the first resistor element, whether at least one of the plurality of first protection circuits is in operating state.

3. The power switching apparatus according to claim 1, wherein
   the control circuit includes a first output node as the at least one output node,
   the balance resistor units each include:
     a first rectifying element and a third resistor element connected in series with each other between the first output node of the control circuit and the control electrode of the associated semiconductor switching device; and
     a fourth resistor element connected in parallel with a combination of the first rectifying element and the third resistor element,
   the first rectifying element is configured to block current in a direction from the control electrode to the first output node,
   the second protection circuit is provided for each of the balance resistor units, and
   the second protection circuit determines whether an associated protection circuit of the plurality of first protection circuits is in operating state, based on a voltage generated at the third resistor element of the associated balance resistor unit.

4. The power switching apparatus according to claim 1, wherein
   the control circuit includes a first output node as the at least one output node,
   the balance resistor units each include:
     a first rectifying element and a third resistor element connected in series with each other between the first output node of the control circuit and the control electrode of the associated semiconductor switching device; and a second rectifying element and a fourth resistor element connected in series with each other and in parallel with a combination of the first rectifying element and the third resistor element, the first rectifying element is configured to block current in a direction from the control electrode to the first output node, the second rectifying element is configured to block current in a direction from the first output node to the control electrode, the second protection circuit is provided for each of the balance resistor units, and the second protection circuit determines, based on a voltage generated at the third resistor element of the associated balance resistor unit, whether an associated protection circuit of the plurality of first protection circuits is in operating state.

5. The power switching apparatus according to claim 1, wherein
the control circuit includes, as the at least one output node, a first output node connected with a power supply node and a second output node connected with a ground node,
the balance resistor units are each connected between the control electrode of the associated semiconductor switching device and each of the first output node and the second output node,
the balance resistor units each include:
a third resistor element connected between the first output node of the control circuit and the control electrode of the associated semiconductor switching device;
a fourth resistor element connected between the second output node of the control circuit and the control electrode of the associated semiconductor switching device; and
a first rectifying element connected in series with one of the third resistor element and the fourth resistor element,
the second protection circuit is provided for each of the balance resistor units, and
the second protection circuit determines, based on one of a voltage generated at the third resistor element of the associated balance resistor unit and a voltage across the associated balance resistor unit, whether an associated protection circuit of the plurality of first protection circuits is in operating state.

6. The power switching apparatus according to claim 1, wherein
the control circuit includes a first output node as the at least one output node,
the balance resistor units each include:
a first rectifying element and a third resistor element connected in series with each other between the first output node of the control circuit and the control electrode of the associated semiconductor switching device; and
a second rectifying element and a fourth resistor element connected in series with each other and in parallel with a combination of the first rectifying element and the third resistor element,
the first rectifying element blocks current in a direction from the control electrode to the first output node,
the second rectifying element blocks current in a direction from the first output node to the control electrode,
the power switching apparatus further comprises a plurality of third rectifying elements each including a cathode connected to a connecting line between an associated one of the balance resistor units and the control electrode of an associated one of the semiconductor switching devices,
the third rectifying elements each have an anode connected to a common first connection node,
the second protection circuit is connected between the first output node and the first connection node, and
the second protection circuit determines, based on a voltage generated at each of the balance resistor units, whether at least one of the plurality of first protection circuits is in operating state.

7. The power switching apparatus according to claim 1, wherein
the control circuit includes, as the at least one output node, a first output node connected with a power supply node and a second output node connected with a ground node,
the balance resistor units are each connected between the control electrode of the associated semiconductor switching device and each of the first output node and the second output node,
the balance resistor units each include:
a third resistor element connected between the first output node of the control circuit and the control electrode of the associated semiconductor switching device;
a fourth resistor element connected between the second output node of the control circuit and the control electrode of the associated semiconductor switching device; and
a first rectifying element connected in series with one of the third resistor element and the fourth resistor element,
the power switching apparatus further comprises a plurality of third rectifying elements each including a cathode connected to a connecting line between an associated one of the balance resistor units and the control electrode of an associated one of the semiconductor switching devices,
the third rectifying elements each including an anode connected to a common first connection node,
the second protection circuit is connected between the first connection node and one of the first output node and the second output node, and
the second protection circuit determines, based on a voltage generated at each of the balance resistor units, whether at least one of the plurality of first protection circuits is in operating state.

8. The power switching apparatus according to claim 1, wherein
the semiconductor switching devices are each a self-arc-extinguishing-type semiconductor device made from a wide-bandgap semiconductor wider in bandgap than silicon.

9. The power switching apparatus according to claim 8, wherein
the wide-bandgap semiconductor is any one of silicon carbide, gallium nitride, and diamond.

* * * * *